US008335260B2

(12) United States Patent
Li et al.

(10) Patent No.: US 8,335,260 B2
(45) Date of Patent: Dec. 18, 2012

(54) METHOD AND DEVICE FOR VECTOR QUANTIZATION

(75) Inventors: Lixiong Li, Shenzhen (CN); Libin Guo, Shenzhen (CN); Liang Zhang, Shenzhen (CN); Dejun Zhang, Shenzhen (CN); Wehai Wu, Shenzhen (CN); Tinghong Wang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 1065 days.

(21) Appl. No.: 12/273,201

(22) Filed: Nov. 18, 2008

(65) Prior Publication Data
US 2009/0074076 A1    Mar. 19, 2009

(30) Foreign Application Priority Data

| Dec. 5, 2006 | (CN) | 2006 1 0164455 |
| Jul. 11, 2007 | (CN) | 2007 1 0130519 |
| Dec. 5, 2007 | (WO) | PCT/CN2007/071178 |

(51) Int. Cl.
*H04N 7/12*   (2006.01)
*H04N 7/18*   (2006.01)
*H04N 11/02*  (2006.01)
*G06K 9/36*   (2006.01)
*H03M 7/30*   (2006.01)
*G06T 9/00*   (2006.01)
*H04N 7/28*   (2006.01)
*H04B 7/216*  (2006.01)

(52) U.S. Cl. .......... 375/240.22; 375/240.01; 348/423.1; 382/253

(58) Field of Classification Search ............. 375/240.22, 375/240.01
See application file for complete search history.

(56) References Cited

U.S. PATENT DOCUMENTS
5,398,069 A * 3/1995 Huang et al. ............. 375/240.22
(Continued)

FOREIGN PATENT DOCUMENTS
CN        1420487 A      5/2003
(Continued)

OTHER PUBLICATIONS

Nasrabadi, N.M.; King, R.A.; "Image coding using vector quantization: a review", Communications, IEEE Transactions on vol. 36 , Issue: 8, Digital Object Identifier: 10.1109/26.3776, Publication Year: Aug. 1988 , pp. 957-971.*

(Continued)

*Primary Examiner* — Eleni Shiferaw
*Assistant Examiner* — Courtney Fields
(74) *Attorney, Agent, or Firm* — Brinks Hofer Gilson & Lione

(57) ABSTRACT

A method for quantizing vector. The method includes: performing a quantization process on a vector to be quantized by use of N basic codebook vectors and the adjustment vectors of each of the basic codebook vectors, generating a basic codebook vector and an adjustment vector used for quantizing the vectors to be quantized, N being a positive integer larger than or equal to 1. According to the present invention, based on the method a device for quantizing vector is disclosed. According to embodiments of the present invention, the quantization of an input vector is done by introducing the modification vectors for the base codebook vectors, therefore the memory amount of the base codebook vectors is reduced effectively, and the calculation amount is merely the calculation amount required for going through N codebooks. Therefore, the complexity of the vector quantization could be decreased effectively.

30 Claims, 11 Drawing Sheets

U.S. PATENT DOCUMENTS

| | | | |
|---|---|---|---|
| 6,009,387 A | | 12/1999 | Ramaswamy et al. |
| 6,148,283 A | | 11/2000 | Das |
| 2003/0219167 A1* | | 11/2003 | Pikkarainen et al. ......... 382/253 |
| 2007/0055509 A1 | | 3/2007 | Vasilache et al. |

FOREIGN PATENT DOCUMENTS

| | | | | |
|---|---|---|---|---|
| GB | 2 405 560 A | | 3/2005 | |
| GB | 2463050 A | * | 3/2010 | |
| JP | 5-303398 | | 11/1993 | |
| JP | 2006-295829 A | | 10/2006 | |

OTHER PUBLICATIONS

Kemal Demirciler, Antonio Ortega; "Reduced-complexity deterministic annealing for vector quantizer design"; Jan. 2005; EURASIP Journal on Applied Signal Processing, vol. 2005; pp. 1807-1820.*

Written Opinion of the International Searching Authority issued in corresponding PCT Patent Application No. PCT/CN2007/071178, mailed Mar. 20, 2008.

Office Action issued in corresponding Chinese Patent Application No. 200610164455.2, mailed May 22, 2009.

Office Action issued in corresponding Korean Patent Application No. 10-2009-7005033, mailed Dec. 17, 2010.

Lte, "$3^{rd}$ Generation Partnership Project; Technical Specification Group Service and System Aspects; Audio Codec Processing Functions; Extended Adaptive Multi-Rate—Wideband (AMR-WB+) Codec; Transcoding Functions (Release 8)". 3GPP TS 26.290, V8.0.0, Dec. 2008.

Search Report issued in corresponding PCT Application No. PCT/CN2007/071178; mailed Mar. 20, 2008.

Office Action issued in corresponding Japanese Patent Application No. 2009-536590, issued Jan. 4, 2012.

Office Action issued in corresponding European Patent Application No. 07846024.3, mailed May 15, 2012.

Office Action issued in corresponding Japanese Patent Application No. 2009-536590, mailed Aug. 11, 2011.

Nasrabadi et al. "Image Coding Using Vector Quantization: A Review" IEEE Transactions on Communications, vol. 36. No. 8. Aug. 8, 1988.

Supplementary European Search Report issued in corresponding European Patent Application No. 07 84 6024; issued Jun. 2, 2009.

* cited by examiner

METHOD AND DEVICE FOR VECTOR QUANTIZATION

FIELD

The present embodiments relate to signal processing technologies, and more particularly to a method and a device for vector quantization.

BACKGROUND

In the process of digital compressed encoding of audio signals or video signals, a vector composed of a number of sample values of an input signal may be quantized according to a predetermined vector codebook to ensure encoding quality at a lower encoding rate.

Vector quantization is an efficient data compression technology. The input signal is put into one or more groups each of which has K (K=1, 2, 3 and so on) continuous sample values. The group of sample values can make up a vector in a K-dimension Euclidean Space, and each of such vectors can be quantized. The complexity of vector quantization results from two aspects: calculation load and storage load. The complexity of vector quantization increases exponentially with the increase of the vector dimension. Moreover, as a lossy data compression technology, vector quantization involves the problem of encoding rates in addition to the quantization distortion, and the vector dimension is in inverse proportion to the encoding rate. In an environment with grim network conditions, encoding rates are generally reduced in order to avoid packet loss in the network transmission and ensure encoding quality of a certain level, which increases the complexity of vector quantization.

Taking the process of code compression for voice signals in the related art as an example, the vector quantization technology applied to the voice encoding process in the prior art is described below.

In the quantization of a vector composed of Intermittence Spectral Frequency (ISF) coefficients in the related art, the Wideband Adaptive Multi Rate (AMR-WB+) voice codec is generally used to quantize ISF vectors. The ISF coefficient can be converted from a Linear Prediction Coefficient (LPC) of voice signals. The AMR-WB+ quantizes the SIF vectors through joint Split Vector Quantization (SVQ) and Multi Stage Vector Quantization (MSVQ). The process of vector quantization includes: a 1-order Moving Average (MA) prediction method is applied first to work out the current ISF prediction residual vector of frame n (n=1, 2, 3 and so on)-r(n), and then r(n) is quantized through multi-stage codebooks. Table 1 shows bit allocation and codebook utilization in a vector quantization process in the prior art.

TABLE 1

|  | Grade of splitting | | | | | | |
| --- | --- | --- | --- | --- | --- | --- | --- |
|  | Grade 1 | | Grade 1 | | | | |
| Vector dimension | 9 | 7 | 3 | 3 | 3 | 3 | 4 |
| Quantity of allocated bits | 8 | 8 | 6 | 7 | 7 | 5 | 5 |
| Quantity of codebooks | 256 | 256 | 64 | 128 | 128 | 32 | 32 |

As shown in Table 1, the ISF vector quantization process performed by AMR-WB+ is as follows:

suppose the ISF vector is a 16-dimension vector, r(n) is also a 16-dimension vector. Let $r[r_1, r_2, \ldots, r_{16}]$ in order to reduce the codebook storage load in the vector quantization, the AMR-WB+ performs Split Multi Stage Vector Quantization (S-MSVQ) for vector r:

first, the 16-dimension vector r is split on the first grade to obtain two sub-vectors, namely, 9-dimension vector $r_1^{(1)}$ and 7-dimension vector $r_2^{(1)}$; $r_1^{(1)}$ and $r_2^{(1)}$ are quantized through the 8 bits respectively, and the quantity of codebooks for quantizing both $r_1^{(1)}$ and $r_2^{(1)}$ is 256;

afterward, $r_1^{(1)}$ and $r_2^{(1)}$ are split on the second grade respectively to obtain 5 sub-vectors;

the 9-dimension $r_1^{(1)}$ is split into 3 sub-vectors, namely, 3-dimension $r_{11}^{(2)}$, quantized through 6 bits, the corresponding quantity of codebook vectors is 64; the 3-dimension $r_{12}^{(2)}$ is quantized through 7 bits, and the quantity of codebooks for quantizing both $r_{11}^{(2)}$ and $r_{12}^{(2)}$ is 128, the 3-dimension $r_{13}^{(2)}$ is quantized through 7 bits, and the quantity of codebooks or quantizing $r_{13}^{(2)}$ is 128;

the 7-dimension $r_2^{(1)}$ is split into 2 sub-vectors, namely, 3-dimension $r_{21}^{(2)}$, quantized through 5 bits, and the quantity of codebooks for quantizing $r_{21}^{(2)}$ is 32, the 3-dimension $r_{22}^{(2)}$ is quantized through 5 bits, and the quantity of codebooks for quantizing $r_{22}^{(2)}$ is 32.

The foregoing splitting process gives rise to 7 sub-vectors in total, and involves a total of 46 bits allocated for vector quantization.

The two sub-vectors obtained through the grade-1 splitting mentioned above are quantized on the first grade, and the 5 sub-vectors obtained through the grade-2 splitting are quantized on the second grade. The grade-1 quantization process is similar to the grade-2 quantization process. Let $r_x$ refer to the component on dimension x (x=1, 2, 3 and so on) of a sub-vector in the 7 sub-vectors, and $\hat{r}_x^y$ is the component on dimension x of code word y (y=1, 2, 3 and so on) in the codebook vector corresponding to the sub-vector, the error between $r_x$ and $\hat{r}_x^y$ can be calculated by formula (1), and the square sum of $\Delta_x$ can be calculated by formula (2).

$$\Delta_x = r_x - \hat{r}_x^y \qquad (1)$$

$$E = \sum_{x=m}^{n} [\Delta_x]^2 \qquad (2)$$

Use E as the distortion of the vector quantization, select y corresponding to the code word that minimizes E among the codebook vectors corresponding to the sub-vector, use y as an index code of the code word, and send it to the decoder. Accordingly, the decoder finds the corresponding code word according to the decoded index, and decodes the relevant information.

The AMR-WB+ vector quantization technology in the related art adopts multi-grade codebook vector quantization, which accomplishes high encoding quality but increases the complexity of vector quantization. The complexity of vector quantization is attributable to storage load and calculation load. In the related art, the codebook storage load is high, which leads to increase of calculation load. In the calculation process, all codebook vectors have to be traversed. Therefore, the related art requires further improvement with respect to reducing complexity of vector quantization.

SUMMARY

According to embodiments of the present invention, a method and a device for reducing complexity of vector quantization are provided.

In one embodiment, a method for vector quantization includes: obtaining a vector to be quantized; obtaining a basic codebook vector, in which the basic codebook vector includes one or more basic sub-vectors; in the several basic sub-vectors, at least one K-dimension (K≧2) basic sub-vector corresponds to an adjustment vector collection which includes N adjustment vectors corresponding to the K-dimension basic sub-vectors, and at least one adjustment vector collection meets the requirement that N is less than the quantity of all possible combinations of different values of each dimension of any dimension of all adjustment vectors in the collection; obtaining the adjustment vector corresponding to the basic sub-vector; regarding the combination of the basic codebook vector and at least one adjustment vector corresponding to different basic sub-vectors as a joint codebook vector, and selecting a joint codebook vector for quantization among possible joint codebook vectors according to the deviation between the joint codebook vector and the vector to be quantized; and obtaining an index of the basic codebook vector corresponding to the selected joint codebook vector and an index of the adjustment vector.

In another embodiment, a device for vector quantization includes: a vector input unit for obtaining the vector to be quantized; a basic codebook unit for providing a basic codebook vector, wherein the basic codebook vector includes one or more basic sub-vectors; in the several basic sub-vectors, at least one K-dimension (K≧2) basic sub-vector corresponds to an adjustment vector collection which includes N adjustment vectors corresponding to the K-dimension basic sub-vectors, and at least one adjustment vector collection meets the requirement that N is less than the quantity of any combination of different values of all adjustment vector collection in any dimension; an adjustment vector unit for providing an adjustment vector corresponding to the basic sub-vector; a quantizing unit for obtaining the basic codebook vector and the adjustment vector from the basic codebook unit and the adjustment vector unit, regarding the combination of the basic codebook vector and one or more adjustment vectors corresponding to different basic sub-sectors as a joint codebook vector, and selecting a joint codebook vector for quantization among the possible joint codebook vectors according to the deviation between the joint codebook vector and the vector obtained by the vector input unit.

In the foregoing vector quantization process, the vector is quantized through a joint codebook vector composed of a basic codebook vector and the adjustment vector of its subvector; because the basic codebook vector is adjusted through an adjustment vector, relevance between dimensions is utilized efficiently, the quantity of adjustment vectors is reduced, and a great dynamic adjustment range is accomplished, thus reducing the calculation load for quantization and simplifying the computation.

An embodiment provides a simplified method for vector quantization.

An embodiment also provides a method for generating a codebook adjustment vector.

Further, an embodiment provides a simplified device for vector quantization.

A method for vector quantization includes: performing a quantization process on a vector to be quantized by use of N basic codebook vectors and the adjustment vectors of each of the basic codebook vectors; and generating a basic codebook vector and an adjustment vector used for quantizing the vectors to be quantized. Where N is a positive integer larger than or equal to 1.

A method for generating a codebook adjustment vector includes: calculating an average vector of N codebooks, N being a positive integer larger than or equal to 1; calculating a distance from each of the codebooks to the average vector; and generating an adjustment vector of each of the codebooks according to the distance from each of the codebooks to the average vector.

A device for quantizing vector includes a codebook providing unit, an adjustment vector providing unit, and a quantizing unit, in which the codebook providing unit is adapted to transfer N codebooks corresponding to a vector to be quantized to the quantizing unit, and N is a positive integer larger than or equal to 1; the adjustment vector providing unit is adapted to transfer adjustment vectors of each codebooks to the quantizing unit; and the quantizing unit is adapted to receive the adjustment vectors of each codebooks from the adjustment vector providing unit, and from the codebook providing unit, perform a quantization process on a vectors to be quantized by use of N codebooks and the adjustment vectors of each codebooks, and obtain codebooks and adjustment vectors for quantizing the vector to be quantized.

The foregoing vector quantization method uses N (N=1, 2, 3 and so on) codebooks and an adjustment vector of each codebook to quantize the input vector. Namely, the adjustment vector of the codebooks provided in the present invention takes part in the process of quantizing the input vector. Therefore, the storage load of codebooks is reduced, and the computation load is only the calculation load required for traversing N codebooks. Therefore, the foregoing vector quantization method reduces the complexity of vector quantization effectively.

In the foregoing vector quantization device, the quantizing unit uses the N codebooks transferred by the codebook providing unit and the adjustment vector providing unit as well as the adjustment vector of each codebook to quantize the input vector. As a result, fewer codebooks are required, and the computation load is only the calculation load required for traversing N codebooks. Therefore, the foregoing vector quantization device reduces the complexity of vector quantization effectively.

DETAILED DESCRIPTION

A vector quantization solution is provided in one embodiment. In one embodiment, the vector to be quantized is quantized according to a reference vector based on the vector to be quantized and an adjustment vector for adjusting the reference vector to be more proximate to the vector to be quantized. Therefore, the embodiment avoids the need of storing massive codebook vectors which are used for vector quantization for different grades of split sub-vectors, reduces the space required for storing codebook vectors; moreover, by selecting a proper reference vector and a corresponding adjustment vector, the embodiment of the present invention ensures high encoding quality. In the embodiment, reference vectors are also known as basic codebook vectors herein.

The technical solution is hereinafter described in detail with reference to embodiments.

Embodiment 1

Figure 1:
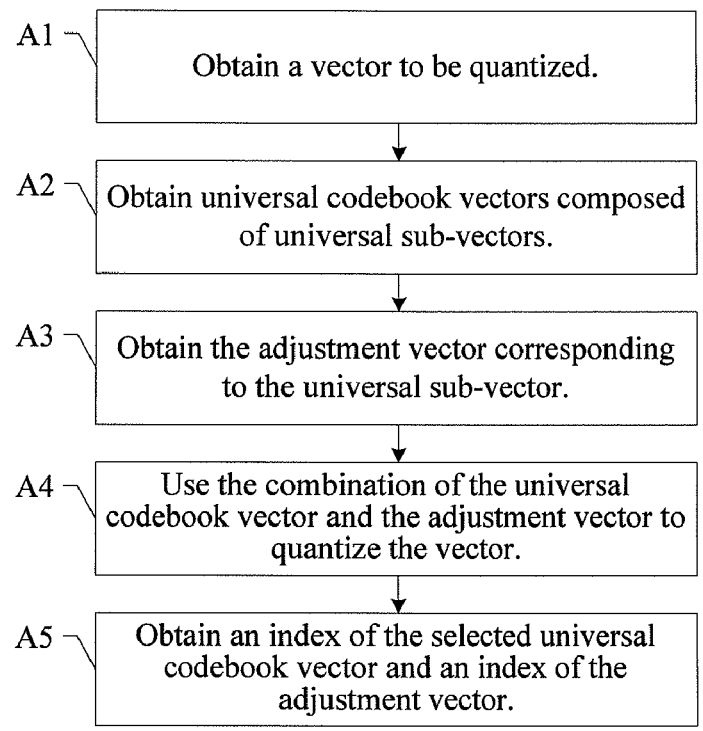
FIG. 1 is a flow chart of the vector quantization method according to the first embodiment.

FIG. 1 is a flow chart of a vector quantization method according to one embodiment. The process include sact.

A1. Obtain a vector to be quantized.

The vector to be quantized in this embodiment may be an original vector initially input in the vector quantization process, a sub-vector obtained after the original vector is split, or a residual vector of the original vector relative to a certain vector.

For example, for an L-dimension (L=1, 2, 3 and so on) vector V, $V=\{v_1, v_2, \ldots, v_L\}$;

if V is split into K sub-vectors, $$V=\{V_1, V_2, \ldots, V_K\}$$

The quantity of dimensions of each sub-vector $V_i$ (i=1, ..., K) may be the same as or different from the quantity of dimensions of other sub-vectors. The $V_i$ is as follows:

$$V_1=\{v_1, v_2, \ldots, v_{x1}\};$$

$$V_2=\{v_{x1+1}, v_{x1+2}, \ldots, v_{x2}\};$$

...

$$V_K=\{V_{x(K-1)+1}, v_{x(K-1)+2}, \ldots, v_{xK}\}, xK=L.$$

Note the quantity of dimensions of $V_i$ as I, then:

$$V_i=\{v_{x(i-1)+1}(1), v_{x(i-1)+2}(2), \ldots, v_{xi}(I)\};$$

Note the component on dimension m of $V_i$ as $v_{x(i-1)+m}(m)$, (m=1, ..., I).

The vector to be quantized may be one or more sub-vectors $V_i$ or V. In this embodiment of the invention, the quantization object is supposed to be V.

A2. Obtain a basic codebook vector.

For the vector to be quantized, a total of A (A=1, 2, 3 and so on) basic codebook vectors may be referenced. The quantity of dimensions of the basic codebook vector is the same as the quantity of dimensions of the vector to be quantized, for example, Let $U_a=\{u_{a1}, u_{a2}, \ldots, u_{aL}\}$, a=1, ..., A, $U_a$ may be split into K basic sub-vectors, $U_a=\{U_{a1}, U_{a2}, \ldots, U_{aK}\}$;

Each basic sub-vector $U_{aj}$ has a corresponding $V_i$, j=1, ..., K. $U_{aj}$ is as follows:

$$U_{a1}=\{u_{a1}, u_{a2}, \ldots, u_{a(x1)}\};$$

$$U_{a2}=\{u_{a(x1+1)}, u_{a(x1+2)}, \ldots, u_{a(x2)}\}$$

...

$$U_{ak}=\{u_{a(x(K-1)+1)}, u_{a(x(K-1)+2)}, \ldots, u_{a(xK)}\}.$$

The basic codebook vector may be a codebook vector obtained directly through various codebook vector training modes, or a preferred codebook vector searched out of a larger scope of codebook vectors, or a codebook sub-vector including some dimensions in a codebook vector with many dimensions, as is not limited in this embodiment.

In this embodiment, V is quantized based on each $U_{aj}$. Accordingly, the quantity of dimensions of each basic sub-vector is the same as the quantity of dimensions of the corresponding $V_i$ for example:

$$U_{aj}=\{u_{x(j-1)+1}(1), u_{x(j-1)+2}(2), \ldots, u_{xj}(I)\};$$

Note the component on dimension m of $U_j$ as $u_{x(j-1)+m}(m)$.

A3. Obtain an adjustment vector corresponding to the basic codebook vector.

For the basic codebook vector $U_a$, the corresponding adjustment vector may be one or more vectors whose quantity of dimensions is the same as the quantity of dimensions of Ua. If the vector to be quantized has a high quantity of dimensions, the quantization process is preferably based on the sub-vectors obtained out of splitting. Accordingly, the adjustment vector corresponding to the basic codebook vector may be adjusted. Further, after the basic codebook vector is split into multiple basic sub-vectors, the adjustment vector(s) corresponding to the basic codebook vector may be equivalent to the adjustment vector(s) corresponding to each basic sub-vector. For example, N adjustment vectors (N=1, 2, 3 and so on) corresponds to a basic sub-vector $U_{aj}$ and the quantity of dimensions of the adjustment vectors is the same as the quantity of dimensions of the $U_{aj}$. Note the adjustment vector corresponding to $U_{aj}$ as $ADJ_{af}$ (f=1, ..., N):

$$ADJ_{a1}=\{adj_{a11}, adj_{a12}, \ldots, adj_{a1I}\};$$

$$ADJ_{a2}=\{adj_{a21}, adj_{a22}, \ldots, adj_{a2I}\};$$

...

$$ADJ_{aN}=\{adj_{aN1}, adj_{aN2}, \ldots, adj_{aNI}\}.$$

Note that an adjustment vector collection ADJ is composed of $ADJ_{af}$, which may include one or more adjustment vectors ($ADJ_{af}$). Each basic sub-vector may have a corresponding adjustment vector collection for correcting the basic sub-vector at the time of quantizing a vector. The basic sub-vectors may have no corresponding adjustment vector collection. Moreover, multiple basic sub-vectors with the same quantity of dimensions may share one or more adjustment vector collections. Generally, a trained basic codebook vector is not directly applicable to accurate vector quantization. Therefore, the adjustment vector collection needs to be set for correcting relevant basic sub-vectors. Different adjustment vector collections may include the same or a different quantity of adjustment vectors.

Suppose that in the adjustment vector collection, each adjustment vector is a multi-dimension vector, and each dimension in each adjustment vector is called "adjustment vector". Then, in the adjustment vector collection, if the value of N is less than the quantity of all possible combinations of different adjustment vectors on each dimension in the collection into an adjustment vector, the adjustment vector collection is called an optimized adjustment vector collection. Conversely, if the value of N is equal to the quantity all possible combinations, the adjustment vector collection is a non-optimized adjustment vector collection. For non-optimized adjustment vector collections, the change of the adjustment vector on one dimension is not related to the adjustment vector on another dimension. Therefore, the function of the adjustment vector collection is to adjust each dimension of the adjustment vector separately.

For example, an optimized adjustment vector collection has three two-dimension adjustment vectors $\{\{-1, -1\}, \{0, 0\}, \{1, 1\}\}$. All adjustment vector of the optimized adjustment vector collection has three different values $\{-1, 0, 1\}$ on the first dimension or the second dimension. Therefore, the different values are been as the elements of a two-dimension vector, and there are nine modes of the combinations of the two-dimension vector. The combinations of the two-dimension vector include $\{\{-1, -1\}, \{-1, 0\}, \{-1, 1\}, \{0, -1\}, \{0, 0\}, \{0, 1\}, \{1, -1\}, \{1, 0\}, \{1, 1\}\}$. The foregoing optimized adjustment vector collection $\{\{-1, -1\}, \{0, 0\}, \{1, 1\}\}$ is optimized because it is parts of the two-dimension vector. Based on the optimized adjustment vector collection, a lower bit overhead is required for quantizing vectors, thus accomplishing a better encoding effect.

The $U_a$ may be divided into $U_{aj}$ according to the statistic analysis on the vector V to be quantized. For example, the residual vector between V and $U_a$ may be displayed in the simultaneously varying way, namely, the dimensions which increase or decrease simultaneously may be included into the same $U_{aj}$. As a result, the design of the optimized adjustment vector combinations corresponding to the $U_{aj}$ may allow more for the circumstance in which all dimensions increase or decrease simultaneously. Compared with the adjustment mode which ignores the interrelation between dimensions, the quantity of possible combinations of adjustment combinations is decreased on condition that the dynamic range is the same. If the quantity of possible adjustment combinations is the same, the dynamic range of the adjustment is increased effectively.

The adjustment vectors of the basic codebook vectors and each basic sub-vector may be combined into a joint codebook vector, namely, at least one dimension of elements of the basic codebook vector is corrected by the adjustment vector.

The adjustment vector $ADJ_{af}$ for correcting a $U_{aj}$ may be offered in a certain way. For example, a proper $g_{af}$ is found in a relation vector collection that has multiple relation vectors $g_{af}$. The $g_{af}$ is the $ADJ_{af}$ or a definite function relation related to the $ADJ_{af}$. Examples of such function relation are:

(1) Product relation: for example, the $ADJ_{af}$ may be expressed as a product of the $g_{af}$ and a real number;

(2) Sum/difference relation: for example, the $ADJ_{af}$ may be expressed as a sum or difference between $g_{af}$ and a reference vector;

It should be noted that the reference vector may be a vector determined by an "f" value of other $ADJ_{af}$ that belongs to the same joint codebook vector. In this case, the reference vector may be called a "reference codebook vector", which denotes further adaptive adjustment that should be performed by the subsequently selected adjustment vector when another adjustment vector has a certain value.

(3) Hybrid relation: for example, the $ADJ_{af}$ may be expressed as a difference between the reference codebook vector and the product of the $g_{af}$ and a real number;

The $g_{af}$ may be offered in many ways, for example, the relation vector collection is stored and each $g_{af}$ contained in the collection is traversed directly; or the $g_{af}$ corresponding to one of the $U_{aj}$ is obtained through a definite calculation mode. Typical modes will be described in the subsequent embodiments.

A4. Regard the combination of a basic codebook vector and one or more adjustment vectors corresponding to different basic sub-vectors as a joint codebook vector; according to the deviation between the joint codebook vector and the vector to be quantized, select a joint codebook vector for quantization among the possible joint codebook vectors.

This embodiment quantizes a vector V to be quantized through joint search for the basic codebook vector $U_a$ and the $ADJ_{af}$ corresponding to each $U_{aj}$ of the $U_a$.

Suppose that K (K=1, 2, 3 and so on) $U_{aj}$ sub-vectors of the basic codebook vector $U_a$ have a corresponding adjustment vector collection, and the quantity of the $ADJ_{af}$ corresponding to K $U_{aj}$ sub-vectors is $N_1, N_2, \ldots, N_K$ respectively. Then the quantity of possible joint codebook vectors composed of a basic codebook vector $U_a$ and an adjustment vector $ADJ_{af}$ is:

$$\text{Total}=A*N_1*N_2*\ldots*N_K.$$

According to the deviation between the joint codebook vector and the vector V to be quantized, a joint codebook vector for quantization is selected among those joint codebook vectors. The selection may be based on more than the deviation between the joint codebook vector and the vector V, and may be based on the deviation between the joint codebook vector and a reference vector additionally.

In the process of calculating the deviation between the joint codebook vector and the vector V to be quantized, the joint codebook vectors may be searched out in various ways, including but not limited to:

(i) Hierarchical calculation: calculating the best adjustment vector collocated with each $U_{aj}$, and then comparing the $U_{aj}$ with the collocated best adjustment vector, including the following actacts:

1. Calculate the residual vector between the vector to be quantized and the current basic codebook vector; the residual vector has several residual sub-vectors, and the dividing way of the residual sub-vectors is the same as the way of the basic sub-vectors.

If the vector V is an L-dimension vector, the residual vector $R_a$ between V and $U_a$ is also an L-dimension vector. In the way of dividing the $U_a$, the $R_a$ is divided into K residual sub-vectors (K=1, 2, 3 and so on):

$$R_a=\{R_{a1}, R_{a2}, \ldots, R_{aK}\};$$

$$R_{aj}=\{r_{aj}(1), r_{aj}(2), \ldots, r_{aj}(I)\}.$$

2. For a basic sub-vector corresponding to an adjustment vector collection, select the best adjustment vector of the current basic sub-vector according to the deviation between the adjustment vector in the adjustment vector collection and the corresponding residual sub-vector.

Select the best adjustment vector for each $U_{aj}$ of the current $U_a$. If a $U_{aj}$ has no corresponding adjustment vector collection, no adjustment is required. On the occasion of selecting the best adjustment vector, the deviation is judged in many ways, which is not limited herein. For example, accumulation of absolute residues of the common-dimension component, accumulation of square value of residues, or accumulation of weighted square value of residues may apply.

Suppose that an i-dimension (i=1, 2, 3 and so on) $U_{aj}$ corresponds to an optimized adjustment vector collection has $N_j$ adjustment vectors ($ADJ_{jf}$), the deviation may be expressed in the following way on the occasion of selecting the best adjustment vector of the $U_{aj}$:

$$\Delta a_j = \sum_{i=1}^{I} w_j(i)|r_j(i) - ADJ_{jf}(i)|^2$$

Where $w_j(i)$ is a weight of the residual of the component on dimension i between $r_j$ and $ADJ_{jf}$. In act A3, search out an $ADJ_{jf}$ comparing with the $\Delta a_j$, select the best adjustment vector $ADJ_{jf0}$ of $U_{aj}$, note the $f_0$ value of $ADJ_{jf0}$ corresponding to the $U_{aj}$ as $f_{0j}$, $1 \leq f_{0j} \leq N_j$, and note the corresponding deviation as $\Delta a_{j0}$. For non-optimized adjustment vector collections, calculate the best adjustment vector for each dimension of component respectively, and the adjustment vector composed of each dimension of the best adjustment vector is the best adjustment vector.

3. Accumulate the deviation of all the best adjustment vectors and the deviation between the basic sub-vector not corresponding to the adjustment vector collection and the vector to be quantized, and use such the forgoing deviation as the deviation of the best joint codebook vector corresponding to the current basic codebook vector.

Suppose that, among K basic sub-vectors ($U_{aj}$) (K=1, 2, 3 and so on) of a $U_a$, some basic sub-vectors have a corresponding adjustment vector collection, and others are not adjusted. For the non-adjusted basic sub-vectors, the deviation between the sub-vector and the counterpart of the vector V to be quantized is counted into the deviation sum. For ease of description, the deviation between a non-adjusted $U_{aj}$ and the counterpart of V is still noted as $\Delta a_{j0}$, then the deviation of the best joint codebook vector corresponding to $U_a$ is noted as:

$$\Delta a = \sum_{j=1}^{K} \Delta a_{j0}$$

4. Compare the deviation of the best joint codebook vector corresponding to each basic codebook vector, and select a joint codebook vector for quantization.

Calculate and compare A (A=1, 2, 3 and so on) $\Delta a$ of A (A=1, 2, 3 and so on) $U_a$, and select a joint codebook vector for quantization. Suppose that the corresponding deviation is expressed as $\Delta a_0$, $1 \leq a_0 \leq A$.

(ii) Overall calculation: generating a joint codebook vector, and comparing the deviation between the vector V and each different joint codebook vector, including act:

1. Add up the current basic codebook vector and the optional adjustment vector to generate a joint codebook vector.

Suppose that K basic sub-vectors ($U_{aj}$) of $U_a$ (K=1, 2, 3 and so on) have a corresponding adjustment vector combination, possible joint codebook vector is expressed as:

$$comb(a, n_1, \ldots, n_k) = U_a + \sum_{j=1}^{K} ADJ_{jf}$$

Where $n_1, \ldots, n_K$ are "f" values of $ADJ_{jf}$ corresponding to $U_{aj}$. If the quantity of $ADJ_{jf}$ in the adjustment vector combination is $\{N_1, N_2, \ldots, N_K\}$, a number of $N_1*N_2* \ldots *N_K$ joint codebook vectors can be generated for each $U_a$. All of the $U_a$ may generate joint codebook vectors which amount to Total=$A*N_1*N_2* \ldots *N_K$.

2. Calculate the deviation between the current joint codebook vector and the vector to be quantized.

The way of calculating deviation is similar to the way of calculating the deviation between $ADJ_{jf}$ and $r_j$ in the hierarchical calculation except that the calculation range is extended to all dimensions of the vector V. The deviation between the vector V and the joint codebook vector is expressed as $\Delta(a, n_1, \ldots, n_K)$.

3. Compare the deviation between each different joint codebook vector and the vector to be quantized, and select a joint codebook vector for quantizing.

If joint codebook vectors are generated regularly in a specific sequence, it is not necessary to generate all joint codebook vectors totally. For example, fixing $\{a, n_1, \ldots, n_K\}$; searching out $ADJ_{jf}$ corresponding to $U_{aj}$ through actact A3, and generating a joint codebook vector, then n may be fixed as "$n_0$" after the joint codebook vector that has the best $\Delta a_{j0}$ is searched out through comparison, without the need of generating a joint codebook vector whose n is of other values when $\{a, n_1, \ldots, n_K\}$ changes. I The maximum number of joint codebook vectors to be generated is (suppose that all adjustment vector collections are traversed; if the value of some adjustment vectors in the adjustment vector collection may vary independently in a certain range, the independently varying adjustment vectors may be determined first through searching, without the need of traversing all possible adjustment vector collections, and the maximum number can be even less):

total=$A*[N_1+(N_2-1)+ \ldots +(N_K-1)]=A*(N_1+N_2+ \ldots +N_K-K+1)$.

Among them, select a joint codebook vector ultimately for quantization. Suppose that the corresponding deviation is expressed as $\Delta(a_0, n_1, \ldots, n_K)$, $1 \leq a_0 \leq A$, $1 \leq n_{0k} \leq N_k$.

A5. Obtain an index of the basic codebook vector corresponding to the selected joint codebook vector, and an index of the adjustment vector.

The index of the basic codebook vector and adjustment codebook vector may be arranged in many ways, which is not limited herein. For example, the sequence number of a vector arranged in a similar collection may be used as an index of the vector.

For the joint codebook vector selected through method 1 in actact A4, according to the ultimately selected deviation $\Delta a_0$, the index of the basic codebook vector can be determined as $a_0$; according to each $\Delta a_{k0}$ corresponding to $\Delta a_0$, the index of K adjustment vectors can be determined as $\{n_{01}, n_{02}, \ldots, n_{0K}\}$, thus obtaining the collection of all quantization indexes $\{a_0, n_{01}, n_{02}, \ldots, n_{0K}\}$.

For the joint codebook vector selected through method 2 in actact A4, according to the ultimately selected deviation $\Delta(a_0, n_1, \ldots, n_K)$, the collection of all quantization indexes can be determined as $\{a_0, n_{01}, n_{02}, \ldots, n_{0K}\}$.

After decoding the quantization index collection $\{a_0, n_{01}, n_{02}, \ldots, n_{0K}\}$, the decoder may find the corresponding basic codebook vector $U_a$ according to $a_0$. In each adjustment vector collection corresponding to each $U_{aj}$, the corresponding adjustment vector $ADJ_{jf}$ ($1 \leq j \leq K$) is found according to $\{n_{O1}, n_{O2}, \ldots, n_{OK}\}$. The $U_a$ is combined with K adjustment vectors ($ADJ_{jf}$) to restore the approximate value of the vector V.

In one embodiment, the vector is quantized through a joint codebook vector composed of a basic codebook vector and the adjustment vector of its sub-vector. Because the basic codebook vector is adjusted through an adjustment vector, the dynamic range of the basic codebook vector is broadened effectively and the distortion of the basic codebook vector is reduced. As a result, the effect of one-stage quantization is equivalent to or better than the effect of multi-stage quantization, and the codebook storage load and the quantization calculation load are reduced effectively. Moreover, the basic codebook vector is adjusted through an adjustment vector so that the adjustment vector may be designed by making the most of the relevance which still exists between certain dimensions after the vector to be quantized subtracts the basic codebook vector. As a result, less adjustment vectors can implement adjustment in a wider dynamic adjustment range. Meanwhile, the relevance used between dimensions reduces adjustment vectors, and decreases the calculation load for quantization.

Embodiment 2

Figure 2:
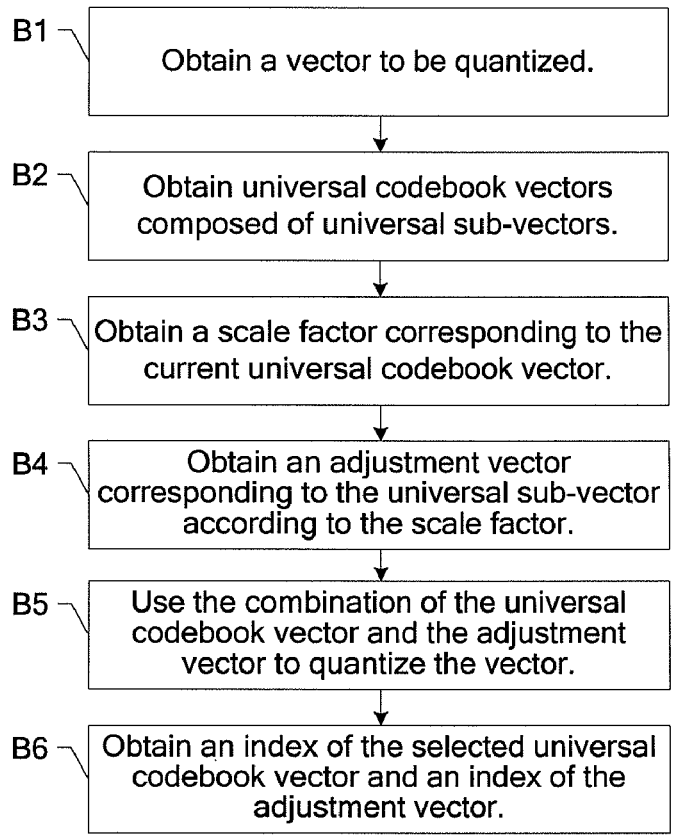
FIG. 2 is a flow chart of the vector quantization method according to the second embodiment.

A method for vector quantization in this embodiment differs from the method in embodiment 1 in that: the method uses a scale factor related to the basic codebook vector to widen the dynamic range of the adjustment vector. As shown in FIG. 2, the process includes the following actacts:

B1 and B2, which are equivalent to actacts A1 and A2 in the first embodiment.

B3. Obtain a scale factor corresponding to the current basic codebook vector.

Suppose that the current basic codebook vector is $U_a$ ($1 \leq a \leq A$), the corresponding scale factor is expressed as $S_a$. The $S_a$ may be obtained by the corresponding $U_a$ from the preset storage, or may be set according to the statistic data or empiric value, or calculated out according to $U_a$.

For exemplary purposes, a method for calculating $S_a$ according to $U_a$ includes the following actacts:

(1) Calculate the average vector of all A (A=1, 2, 3 and so on) basic codebook vectors ($U_a$).

Suppose that $U_a$ is an L-dimension vector, the component on dimension l of the average vector $\vec{u}$ of A (A=1, 2, 3 and so on) basic codebook vectors ($U_a$) is:

$$\vec{u}_l = \frac{1}{A}\sum_{a=1}^{A} ua_l, \; 1 \leq l \leq L.$$

(2) Calculate the distance from each $U_a$ to the average vector $\vec{u}$ and use the distance as a scale factor $S_a$.

$$s_a = \sqrt{\frac{1}{L}\sum_{l=1}^{L}(ua_l - \bar{u}_l)^2}.$$

B4. Obtain an adjustment vector corresponding to the basic sub-vector according to the scale factor.

In this embodiment, the adjustment vector $ADJ_{jf}$ of a basic sub-vector $U_{aj}$ corresponding to $U_a$ is offered through a relation vector collection including multiple relation vectors $g_{jf}$, where $g_{jf}$ is related to $ADJ_{jf}$ as follows:

$$ADJ_{jf} = S_a * g_{jf}$$

A relation vector which is in the above corresponding relation with the $ADJ_{jf}$ is herein called an "adjustment coefficient vector". A collection of adjustment coefficient vectors is called an "adjustment coefficient vector collection". Therefore, the foregoing corresponding relation is interpreted as a product of a scale factor and the adjustment coefficient vector collection corresponding to the basic sub-vector.

For example, suppose that a basic codebook vector U is 4-dimensional, the first two dimensions are the first sub-vector u1, and the latter two dimensions are the second sub-vector u2, and the first sub-vector has a corresponding adjustment vector collection. Suppose that there are two codebook vectors u1 and u2, the scale factor corresponding to the basic codebook vector u1 is s1, and the scale factor corresponding to the basic codebook vector u2 is s2, and the adjustment coefficient vector collection corresponding to the first sub-vector u1 has two adjustment coefficient vectors $\{\{-1, -1\}, \{1, 1\}\}$. Therefore, the adjustment vector collection corresponding to the first sub-vector u11 of u1 is:

$$s1*\{\{-1,-1\},\{1,1\}\}=\{\{-s1,-s1\},\{s1,s1\}\}$$

The adjustment vector collection corresponding to the first sub-vector u21 of u2 is:

$$s2\{\{-1,-1\},\{1,1\}\}=\{\{-s2,-s2\},\{s2,s2\}\}.$$

Because a scale factor corresponds to a basic codebook vector, the index of an adjustment vector in this case may be expressed as the index of the corresponding adjustment coefficient vector. The decoder may restore the corresponding adjustment vector according to the index of the adjustment coefficient vector and the index of the basic codebook vector.

B5. Regard the combination of a basic codebook vector and one or more adjustment vectors corresponding to different basic sub-vectors as a joint codebook vector. According to the deviation between the joint codebook vector and the vector to be quantized, select a joint codebook vector for quantization among the possible joint codebook vectors.

B6. Obtain an index of the basic codebook vector corresponding to the selected joint codebook vector, and an index of the adjustment vector.

B5 and B6 are equivalent to acts A4 and A5 in the first embodiment. It should be noted that in actact B6, because a scale factor corresponds to a basic codebook vector, no extra encoding bits need to be added, and the index of an adjustment vector in this case may be expressed as the index of the corresponding adjustment coefficient vector. The decoder may restore the corresponding adjustment vector according to the index of the adjustment coefficient vector and the index of the basic codebook vector.

This embodiment uses a product of a scale factor and the adjustment coefficient vector to obtain an adjustment vector. Because the value of an adjustment vector is related to a specific $U_a$, different basic codebook vectors ($U_a$) derive different adjustment vector collections through the same adjustment coefficient vector collection. Therefore, the effect of adjustment is better, and the dynamic range of the adjustment vector is widened effectively.

Embodiment 3

Figure 3:
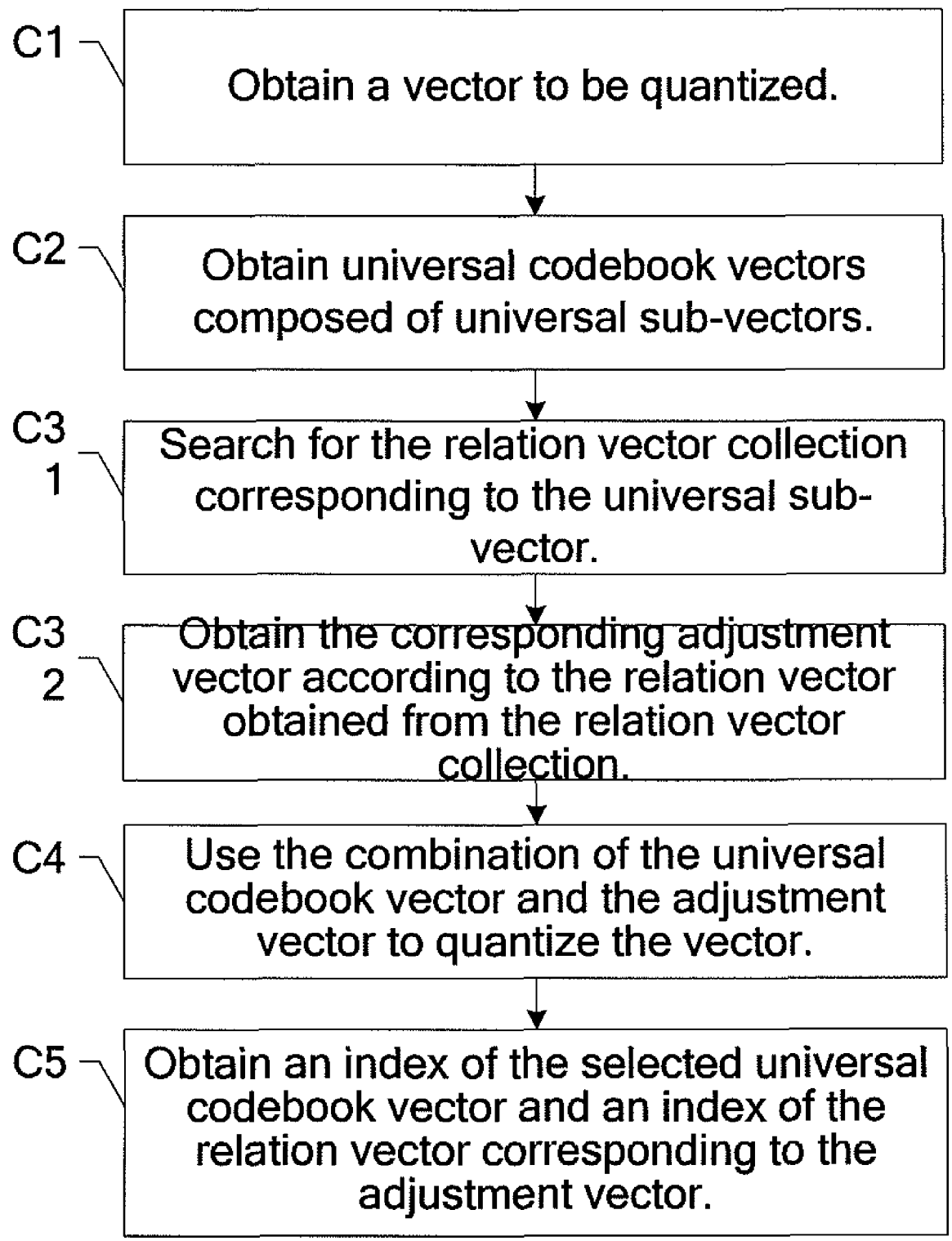
FIG. 3 is a flow chart of the vector quantization method according to the third embodiment.

This embodiment provides a method for obtaining adjustment vectors on the basis of embodiment 1 and embodiment 2. As shown in FIG. 3, the process includes the following actsact:

C1. Obtain a vector to be quantized.

C2. Obtain a basic codebook vector composed of several basic sub-vectors; among the several basic sub-vectors, at least one K-dimension (K≧2) basic sub-vector corresponds to an adjustment vector collection. The adjustment vector collection has N adjustment vectors (N=1, 2, 3 and so on) of K dimension. At least one adjustment vector collection meets the requirement that N is less than the quantity of all possible combinations of different values of each dimension of all adjustment vectors in the adjustment vector collection.

C1 and C2 are equivalent to actacts A1 and A2 in the first embodiment.

C3. Obtain an adjustment vector corresponding to the basic sub-vector, including the following actacts:

C31. Search the relation vector collection corresponding to the basic sub-vector. The relation vector collection is an adjustment vector collection or is in a function relation with the adjustment vector collection. The relation vector may be an adjustment coefficient vector in embodiment 2. In this case, it is necessary to obtain the corresponding scale factor $S_a$ after the basic codebook vector $U_a$ is obtained.

The relation vector collection is searched in the following way:

(1) Search several sub-collections in the relation vector collection. The quantity of relation vectors contained in each sub-collection is equal to the quantity of all possible combinations of different values of each dimension of all relation vectors in the sub-collection.

(2) In each sub-collection, search for different values of each dimension of the corresponding relation vector.

In each sub-collection, each dimension component is not related to any other dimension component. Therefore, the searching mode is similar to the way of searching a non-optimized adjustment vector collection, namely, searching for each dimension component independently.

Suppose that the relation vector collection corresponding to $U_{aj}$ contains N relation vectors $\{g_j, 1, g_j, 2, \ldots, g_j, N\}$. According to the value relation between the dimension components of such relation vectors, the relation vector collection may be regarded as being composed of several sub-collections. In each sub-collection, the values of dimension components of the relation vector are not interrelated any more, and change independently. An extreme scenario is that each relation vector forms a sub-collection separately.

Suppose a relation vector collection {{30, 30}, {30, 20}, {20, 30}, {20, 20}, {0, 5}, {−30, −20}, {−30, −30}}, the relation vector collection can be divided into three sub-collections, which are "too large": {{30, 30}, {30, 20}, {20, 30}, {20, 20}}, "medium": {{0, 5}}, and "too small": {{−30, −30}, {−30, −20}, {−20, −30}, {−20, −20}}.

In the "too large" sub-collection, the 1st dimension and the 2nd dimension of the relation vector are searched out independently in the values "20" and "30" respectively. In the "medium" sub-collection, a unique relation vector is searched out. In the "too small" sub-collection, the 1st dimension and the 2nd dimension of the relation vector are searched out independently in the values "−20" and "−30" respectively.

The sub-collections of the relation vector may be numbered. In each sub-collection, the combination modes are arranged to obtain a sequence number of each combination mode. In this way, a relation vector may be determined by the serial number of the sub-collection that has the relation vector as well as the sequence number of the relation vector in the sub-collection. This practice is essentially consistent with the practice of numbering the relation vectors according to the arrangement of the relation vector in the whole relation vector collection.

C32. Obtain the corresponding adjustment vector according to the relation vector obtained from the relation vector collection.

The obtained relation vector may be an adjustment vector, or may need to be multiplied by a scale factor to obtain an adjustment vector as described in embodiment 2.

C4. Regard the combination of a basic codebook vector and one or more adjustment vectors corresponding to different basic sub-vectors as a joint codebook vector. According to the deviation between the joint codebook vector and the vector to be quantized, select a joint codebook vector for quantization among the possible joint codebook vectors.

C5. Obtain an index of the basic codebook vector corresponding to the selected joint codebook vector, and an index of the adjustment vector.

C4 and C5 are equivalent to actacts A4 and A5 in the first embodiment. It should be noted that in actact C5, the index of the obtained adjustment vector is the sequence number of the relation vector corresponding to the adjustment vector in the relation vector collection. In the case that a relation vector collection is divided into several sub-collections, the sequence number may be expressed as the serial number of the relation vector sub-collection that has the relation vector, and the sequence number of the relation vector in the relation vector sub-collection.

After decoding the sequence number of the relation vector, the decoder may find the relation vector in the corresponding relation vector collection. For example, a sub-collection that has the relation vector is found according to the serial number of the sub-collection, then the relation vector is determined according to the sequence number of the relation vector in the sub-collection, and the adjustment vector is obtained according to the relation between the relation vector and the adjustment vector.

This embodiment obtains an adjustment vector by searching the relation vector collection directly, which requires a low calculation load. If the subdivided sub-collections are used to search the relation vector collection, the relation vectors may be stored in each sub-collection. Each sub-collection provides various combinations of all values of each dimension. Therefore, the values of each dimension instead of the combination modes need to be stored, thus reducing the storage load.

Embodiment 4

Figure 4:
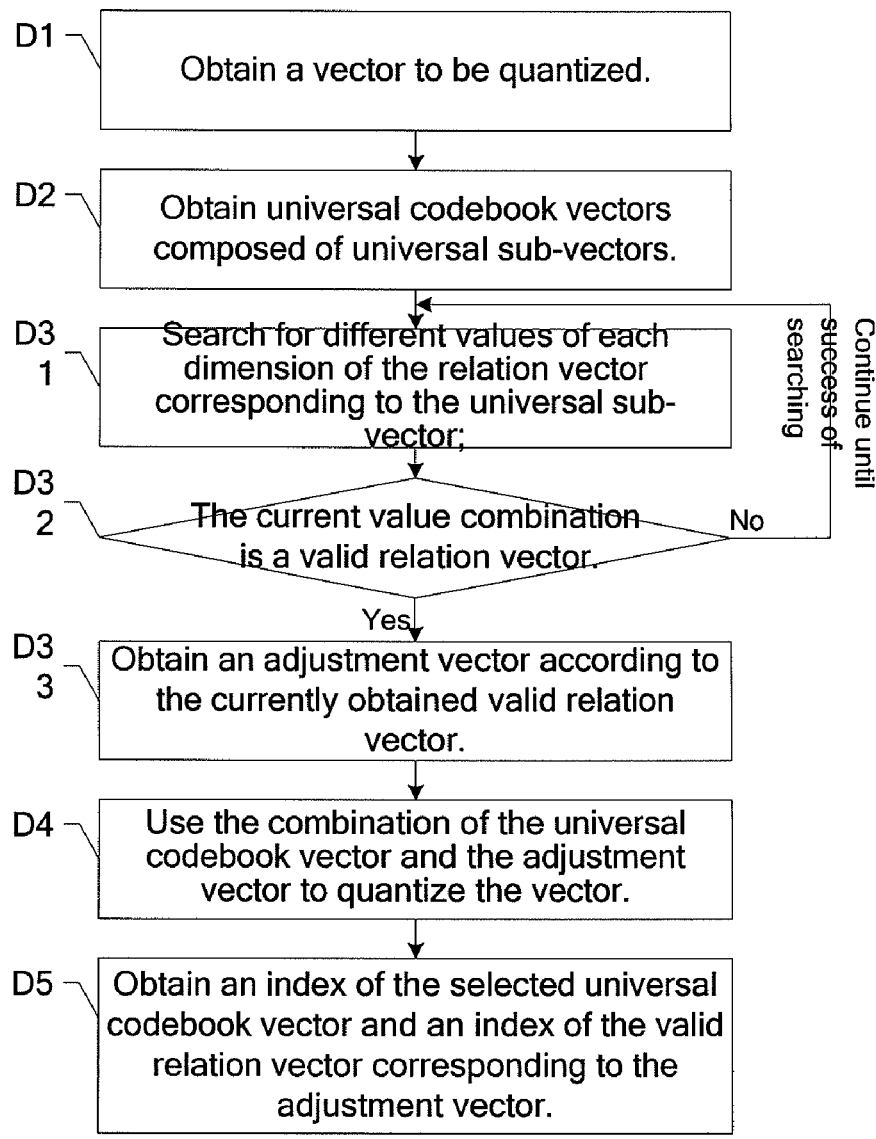
FIG. 4 is a flow chart of the vector quantization method according to the fourth embodiment.

An embodiment of the present invention provides a method for vector quantization. This embodiment differs from the third embodiment in that it provides another specific method for obtaining adjustment vectors. As shown in FIG. 4, the process includes the following actacts:

D1 and D2 are equivalent to actacts A1 and A2 in the first embodiment.

D3. Obtain an adjustment vector corresponding to the basic sub-vector, including the following actacts:

D31. Search for different values of each dimension of the relation vector corresponding to the basic sub-vector There are two searching modes:

Mode 1: Search the combinations of different values without judging the deviation. The search result is a combination of values of each dimension.

Mode 2: In the process of searching for each dimension (with the basic codebook vector unchanged), judge the impact on the deviation of the dimension of the joint codebook vector according to the adjustment vector generated by different values. Thus determining the best value of the dimension. The search result is the best value of each dimension.

D32. Judge whether the combination of the currently obtained values of each dimension is a selectable valid relation vector. If so, the process proceeds to actact D33, and if not, the process proceeds to actact D31 until the search is completed.

The method for judging whether the combination of the currently obtained values of each dimension is a selectable valid relation vector may include the following actacts. Calculate out the sequence number of the combination of the currently obtained values of each dimension in all possible combinations, and judge whether the value combination is a selectable valid relation vector according to the serial number.

Suppose that relation vector is 4-dimensional and each dimension has 5 possible values, there are a total of 625 possible relation vectors. Among them, there are 256 valid relation vectors corresponding to the adjustment vector. Set two fixed arrays with 625 items.

$$Ga[id']=D, id'=\{1,\ldots,625\}, D=1 \text{ or } 0;$$

$$Gb[id']=n, id'=\{1,\ldots,625\}, 1 \leq n \leq 256.$$

The Ga[id'] has 256 id' values corresponding to the D value "1", representing 256 valid relation vectors. The 256 id' values are briefly described as "valid id' values". The Gb[id'] has n ($1 \leq n \leq 256$) values corresponding to the valid id' values. The value of n ($1 \leq n \leq 256$) is the sequence number of the valid id' value. The value of n of Gb[id'] may be set in the way of arranging the valid id' values sequentially, setting an n value from 1 to 256. The n value corresponding to other id' values in the Gb[id'] may be set in any way.

When a possible relation vector {id1, id2, id3, id4} (id1-id 4 are sequence numbers of the dimension components) is searched out, the original sequence number of the relation vector is calculated as:

$$id'=id1*125+id2*25+id3*5+id4$$

Search Ga[id']. If Ga[id']=1, the relation vector is determined as valid, and the corresponding adjustment vector can be further obtained. The n value corresponding to the Ga[id'] is the index of the adjustment vector.

If Ga[id']=0, the relation vector does not correspond to the adjustment vector, and further search is required.

For search mode 1 in D31:

1. When it is determined that the combination of the currently obtained values of each dimension is not a selectable valid relation vector and further search is required, the current combination may be skipped, and the search may go on sequentially;

2. When all value combinations have been traversed, the search is finished; or if all valid relation vectors have been searched out, the search is finished;

3. In this case, every adjustment vector corresponding to each valid relation vector is offered to the corresponding basic sub-vector.

For search mode 2 in D31:

1. When it is determined that the combination of the currently obtained values of each dimension is not a selectable valid relation vector and further search is required, the following processing modes are applicable:

(1) Generating a temporary array which serves to store value combinations of all valid relation vectors, and then searching in the temporary array;

(2) Attempting to adjust the values of one or more dimensions, for example, adjusting the values from a higher dimension to a lower one until the value is adjusted to be valid;

(3) Perform operations in (2) but certain dimensions are restricted from being adjusted.

2. When it is determined that the valid relation vector is searched out, the search is completed;

3. In this case, for each $U_{aj}$ of the basic codebook vector $U_a$, it is equivalent to that the valid relation vector is offered once, the valid relation vector corresponds to the best adjustment vector of the $U_{aj}$.

D33. Obtain an adjustment vector according to the currently obtained valid relation vector.

In this case, the vector collection is adjusted to be a collection of all valid relation vectors or to be in a function relation with the collection of all valid relation vectors. The index of the adjustment vector may be expressed as a serial number of the valid relation vector corresponding to the adjustment vector in all valid relation vectors.

D4. Regard the combination of a basic codebook vector and one or more adjustment vectors corresponding to different basic sub-vectors as a joint codebook vector. According to the deviation between the joint codebook vector and the vector to be quantized, select a joint codebook vector for quantization among the possible joint codebook vectors.

D5. Obtain an index of the basic codebook vector corresponding to the selected joint codebook vector, and an index of the adjustment vector.

D4 and D5 are equivalent to actacts A4 and A5 in the first embodiment. It should be noted that in actact D5, the index of the obtained adjustment vector is the sequence number of the valid relation vector corresponding to the adjustment vector in all relation vectors.

After decoding the sequence number n of the relation vector, the decoder may search out a fixed array of 256 items corresponding to Gb[id']:

$$Gc[n]=id', n=\{1,\ldots,256\}, 1 \leq id' \leq 625$$

in order to restore the original sequence number id' of the relation vector, and then, according to:

$$id4=id'\%5; id4'=Int[id'/5];$$

$$id3=id4'\%5; id3'=Int[id4'/5];$$

$$id2=id3'\%5; id2'=Int[id3'/5];$$

$$id1=id2'\%5.$$

The "%" denotes that the decimal part applies, and the "Int" denotes that the integer part applies. Obtain the sequence number of the value of each dimension component, and thus obtain the corresponding relation vector.

This embodiment uses a surplus search mode (namely, the quantity of combinations searched out is less than the quantity of valid combinations ultimately indexed) to obtain the relation vector, and obtain the corresponding adjustment vector by judging the validity of the combination. As a result, the storage load is reduced because it is not necessary to store the actual combination relations of the valid relation vectors.

The vector quantization method in the above embodiment of the present invention is applicable to various vector quantization processes, and can be applied separately, or used together with other vector quantization methods. The method can be used to perform one-stage quantization for vectors, and further perform a two-stage quantization for the quantization residues or part of the residues after one-stage quantization. It is understandable that the software for implementing the vector quantization method under the present invention may be stored in a computer-readable medium. The method executed by the software includes: obtaining a vector to be quantized; obtaining a basic codebook vector, which has several basic sub-vectors; in the several basic sub-vectors, at least one K-dimension (K≧2) basic sub-vector corresponds to an adjustment vector collection which has N (N=1, 2, 3 and so on) K-dimension adjustment vectors; at least one adjustment vector collection meets the requirement that N is less than the quantity of all possible combinations of different values of each dimension of any dimension of all adjustment vectors in the collection; obtaining the adjustment vector corresponding to the basic sub-vector; regarding the combination of a basic codebook vector and at least one adjustment vector corresponding to different basic sub-vectors as a joint codebook vector, selecting a joint codebook vector for quantization among possible joint codebook vectors according to the deviation between the joint codebook vector and the vector to be quantized; obtaining an index of the basic codebook vector corresponding to the selected joint codebook vector and an index of the adjustment vector. The readable medium may be a ROM/RAM, disk or CD.

Figure 5:
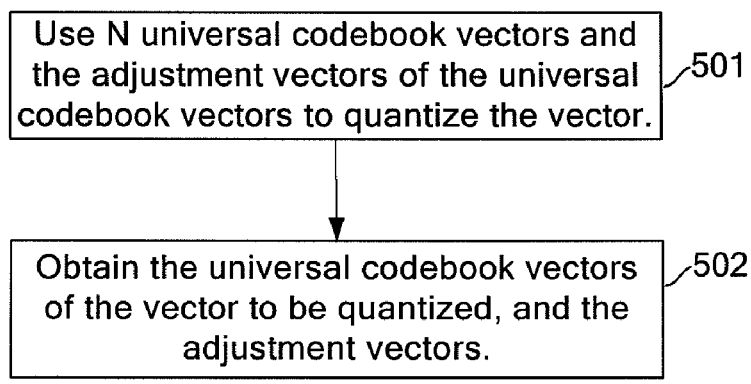
FIG. 5 is an overall flow chart of the vector quantization method in an embodiment.

The technical solution under the present invention is further described below with respect to specific embodiments. FIG. 5 is an overall flow chart of the vector quantization method provided in an embodiment of the present invention. The method includes the following actacts:

ActAct 501: Perform a quantization process on a vectors to be quantized by use of N basic codebook vectors and the adjustment vectors of each of the basic codebook vectors.

ActAct 502: Generate a basic codebook vector and an adjustment vector used for quantizing the vectors to be quantized.

N is a positive integer equal to or greater than 1. The adjustment vector of the basic codebook vector is used to adjust the basic codebook vector, so that the result of quantizing the vector verges on the vector to be quantized.

The vector quantization method in an embodiment of the present invention shown in FIG. 5 is expounded below.

In the practical implementation, it is necessary to generate adjustment vectors of N basic codebook vectors before using N basic codebook vectors and their adjustment vectors to quantize the vector.

Figure 6:
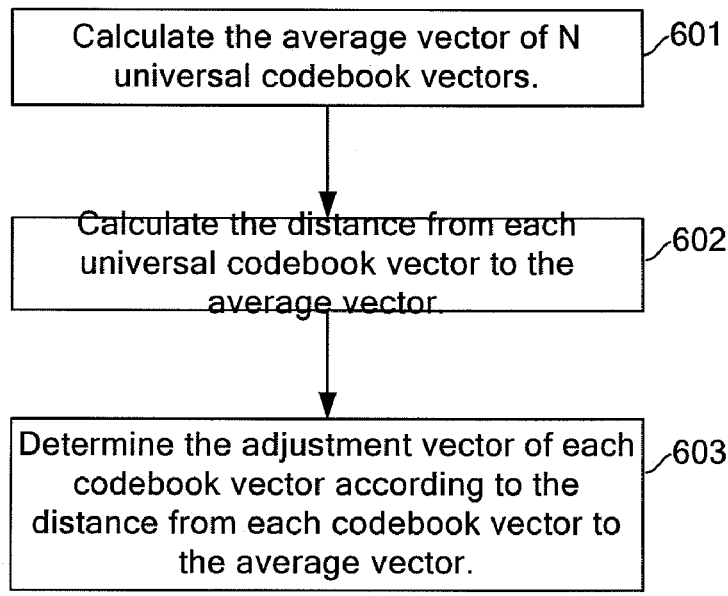
FIG. 6 is a flow chart of the method for generating an adjustment vector of codebooks in one embodiment.

FIG. 6 is a flow chart of generating an adjustment vector of a codebook vector in an embodiment of the present invention, supposing that α-dimension of the vector needs to be optimized. The process includes the following actacts:

ActAct 601: Calculate the average vector of N basic codebook vectors.

In this actact, the average vector of the basic codebook vector is also an α-dimension vector. In this embodiment, the average vector of N basic codebook vectors may be calculated in this way: adding up the components of the same dimension of all N basic codebook vectors, and dividing the sum with N, thus obtaining the component on this dimension of the average vector. Arranging that the component of dimension i of basic codebook vector j is $Y_j(i)$, and arranging that the component of dimension i of the average vector is $AV(i)$, the formula for calculating $AV(i)$ is:

$$AV(i) = \frac{\sum_{j=1}^{N} Y_j(i)}{N}, i = 1, 2, \ldots, a.$$

The average vector $AV(a)$ is an α-dimension vector composed of such components: $AV(a)=\{AV(i), i=1, 2, \ldots, a\}$.

ActAct 602: Calculate the distance from each basic codebook vector to the average vector.

In this embodiment, the calculation process includes calculating the residual between the component on each dimension of basic codebook vector j and the component on the same dimension of the average vector, thus obtaining α (α=1, 2, 3 and so on) component residues, working out the square sum of the α component residues, and dividing the square sum with α, and extracting the square root of the division result, thus obtaining the distance $AVS(j)$ between the basic codebook vector j to the average vector:

$$AVS(j) = \sqrt{\frac{\sum_{i=1}^{a} [Y_j(i) - AV(i)]^2}{a}}, j = 1, 2, \ldots, N,$$

The $AVS(j)$ is a scale factor.

ActAct 603: Generate the adjustment vector of each of the basic codebook vectors according to the distance from each of the basic codebook vectors to the average vector.

In this embodiment, the adjustment vector of each of the basic codebook vectors is generated by generating the adjustment vector of the component of each dimension of the basic codebook vectors. The detailed process includes setting one or more relation vectors corresponding to the adjustment vector of the component of each dimension of the basic codebook vector; at the time of generating the adjustment vector of the component of each dimension of the basic codebook vector, multiplying the distance from the codebook vector to the average vector with each relation vector corresponding to the adjustment vector of the component of this dimension, and using each obtained product as an adjustment vector corresponding to the component of this dimension of the codebook vector; arranging the products corresponding to the component of the current dimension of the basic codebook vector, and using the sequence numbers obtained by the product as the indexes of the adjustment vector corresponding to the product.

Taking basic codebook vector j as an example, the process of generating an adjustment vector of the component on dimension i of codebook vector j includes using $AVS(j)$ as a base value of the adjustment vector of codebook vector j, setting a scale factor for the purpose of further adjusting the base value of the adjustment vector of codebook vector j. Suppose that the relation vector collection configured for i-dimension $Y_j(i)$ of the codebook vector j is $\{0, A1, -A1, A2, -A2\}$, the adjustment vector of the $Y_j(i)$ is an element of the collection $\{0, AVS(j) \times A1, -AVS(j) \times A1, AVS(j) \times A2, -AVS(j) \times A2\}$. If A1=A2=0.3, the adjustment vector of the $Y_j(i)$ is an element of the collection $\{0, AVS(j) \times 0.3, -AVS(j) \times 0.3\}$. Meanwhile, the sequence number of each element in the collection corresponds to the index of the adjustment vector.

The embodiment shown in FIG. 6 provides a method for generating the adjustment vector of a codebook vector. In the practical application, the adjustment vector of the codebook vector may be generated in other ways. For example, the simplest way is to generate the adjustment vector of each codebook vector randomly. However, if the adjustment vector obtained in this way is used for quantizing the residual vector between the codebook vector and the vector to be quantized, the code effect is evidently less stable than the code effect brought by the adjustment vector generated in the embodiment shown in FIG. 6.

Taking the quantization of the ISF vector composed of ISF coefficients as an example, the vector quantization method in an embodiment of the present invention is detailed below, as shown in FIG. 1. For ease of comparison of the code effect and the quantization complexity between the vector quantization method in an embodiment of the present invention and the vector quantization method of AMR-WB+, 46 bits are also used for encoding in this embodiment, suppose that the ISF vector is a 16-dimension vector, and there are 256 codebook vectors which are trained out of the ISF residues corresponding to the 16-dimension ISF vector.

Figure 7:
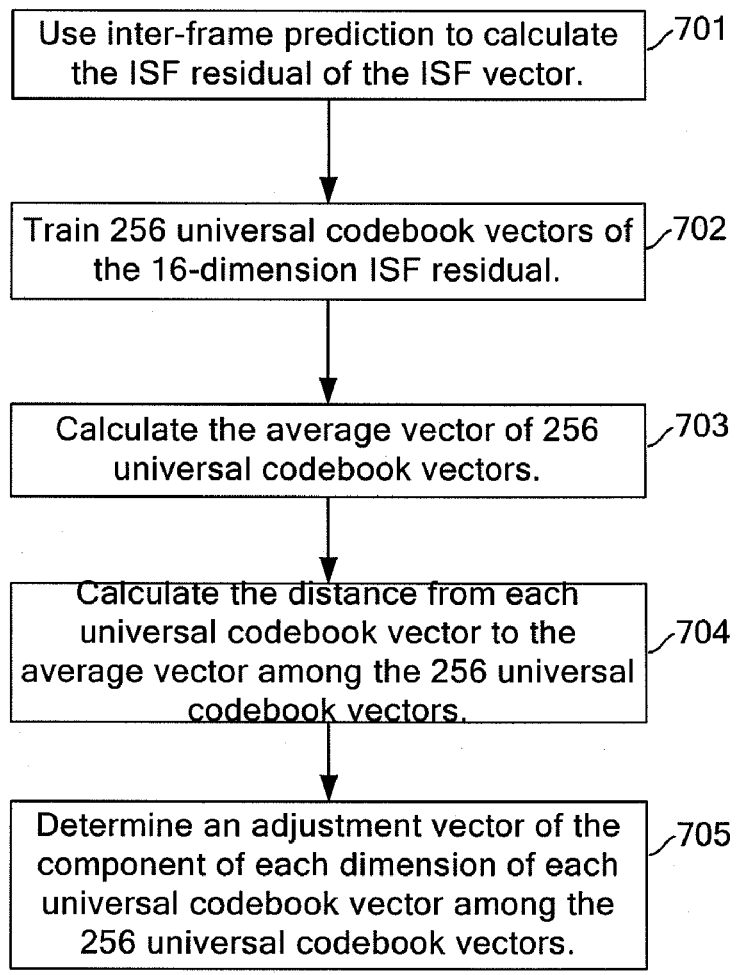
FIG. 7 is a flow chart of the method for generating ISF residual codebooks and their adjustment vectors in one embodiment.

Based on the method for generating the adjustment vector of a codebook vector illustrated in FIG. 6, FIG. 7 shows the process of generating ISF residual codebook vectors and the adjustment vector of each codebook vector in an embodiment of the present invention. The process includes the following actacts:

ActAct 701: Using inter-frame prediction to calculate the ISF residual of the ISF vector.

The practice of calculate the ISF residual in the process of quantizing an ISF vector in the related art is applied here. The calculation process is described briefly below.

Defining $Z_n$ to be an ISF vector of frame n $isf_n$ after de-square value mean_isf, the predicted ISF residual is $R_n$, and the formula is:

$$Z_n = isf_n - \text{mean\_isf}$$

$$R_n = Z_n - P_n$$

where $P_n$ is the predicted ISF vector of frame n:

$$P_n = MA \times R_{n-1}^q$$

where, $R_{n-1}^q$ is the ISF residual after quantization of the previous frame, and MA is an empiric value which is generally ⅓.

ActAct 702: Train 256 codebook vectors of the 16-dimension ISF residual.

In this actact, the vector to be quantized is used as a known vector, and the LBG algorithm is used to train out the N codebook vectors corresponding to the vector to be quantized. The LBG algorithm is a publicly known technology designed to train codebook vectors. For the details of training codebook vectors through the LBG algorithm, refer to other relevant documents. In the practical application, the codebook vector may also be trained through other algorithms.

Each trained codebook vector is also an a-dimension vector (a=1, 2, 3, and so on).

ActAct 703: Calculate the average vector of 256 codebook vectors.

Refer to the description in actact 502, where N=256, a=16.

ActAct 704: Calculate the distance from each codebook vector to the average vector among the 256 codebook vectors.

By reference to the description in actact 503, the AVS(j), namely, the distance from codebook vector j to the average vector, is:

$$AVS(j) = \sqrt{\frac{\sum_{i=1}^{16}[Y_j(i) - AV(i)]^2}{16}}, j = 1, 2, \ldots, 256,$$

In this embodiment, a codebook vector corresponds to a distance value AVS(j). The distance value serves as a base value of the codebook vector. In the practical application, it is appropriate to calculate out multiple base values of a codebook vector, which, however, increases the calculation load of the subsequent quantization.

ActAct 705: Generate an adjustment vector of the component of each dimension of each codebook vector among the 256 codebook vectors.

In this embodiment, seven adjustment vectors are set for components of dimensions 1-6 of each codebook vector, which corresponds to scale factors 0, A1, −A1, B1, −B1, C1, and −C1. Five adjustment vectors are set for components of dimensions 7-13, which correspponding to scale factors 0, A2, −A2, B2, and −B2. Three adjustment vectors are set for dimensions 14-16, which corresponds to scale factors 0, A3, and −A3. Then, taking codebook vector j as an example, the AVS(j) obtained in actact 705 serves as an adjustment vector base value of the component on each dimension of codebook vector j, and the obtained collection of adjustment vectors V(k) of the component on each dimension of codebook vector j is:

for components on dimensions $$1\text{-}6, k=1,2,\ldots,7, i=1,2,6, V(i,k)=\{0, AVS(j) \times A_1, -AVS(j) \times A_1, AVS(j) \times B_1, -AVS(j) \times B_1, AVS(j) \times C_1, -AVS(j) \times C_1\};$$

where, k represents the sequence number of each element in the collection V(i,k), and also the index of the adjustment vector corresponding to components on dimensions 1-6.

For components on dimensions $$7\text{-}13, k'=1,2,\ldots,5, i=7,\ldots,13, V(i,k')=0\{, AVS(j) \times A_2, -AVS(j) \times A_2, AVS(j) \times B_2, -AVS(j) \times B_2\};$$

where, k' represents the sequence number of each element in the collection V(i,k'), and also the index of each adjustment vector corresponding to components on dimensions 7-13.

For components on dimensions $$14\text{-}16, k''=1,2,3, i=14,\ldots,16\ V(i,k'')=\{0, AVS(j) \times A_3, -AVS(j) \times A_3\};$$

where, k" represents the sequence number of each element in the collection V(i,k"), and also the index of each adjustment vector corresponding to components on dimensions 14-16.

Moreover, in this embodiment, if all scale factors are 1, the obtained adjustment vector of the component on each dimension of the codebook vector is V(i,k)={0,AVS(j),−AVS(j)}, k=1, 2, 3, i=1, ..., 16 ....

Therefore, the 256 codebook vectors and their adjustment vectors are obtained, which are subsequently used for quantizing ISF residues.

Figure 8:
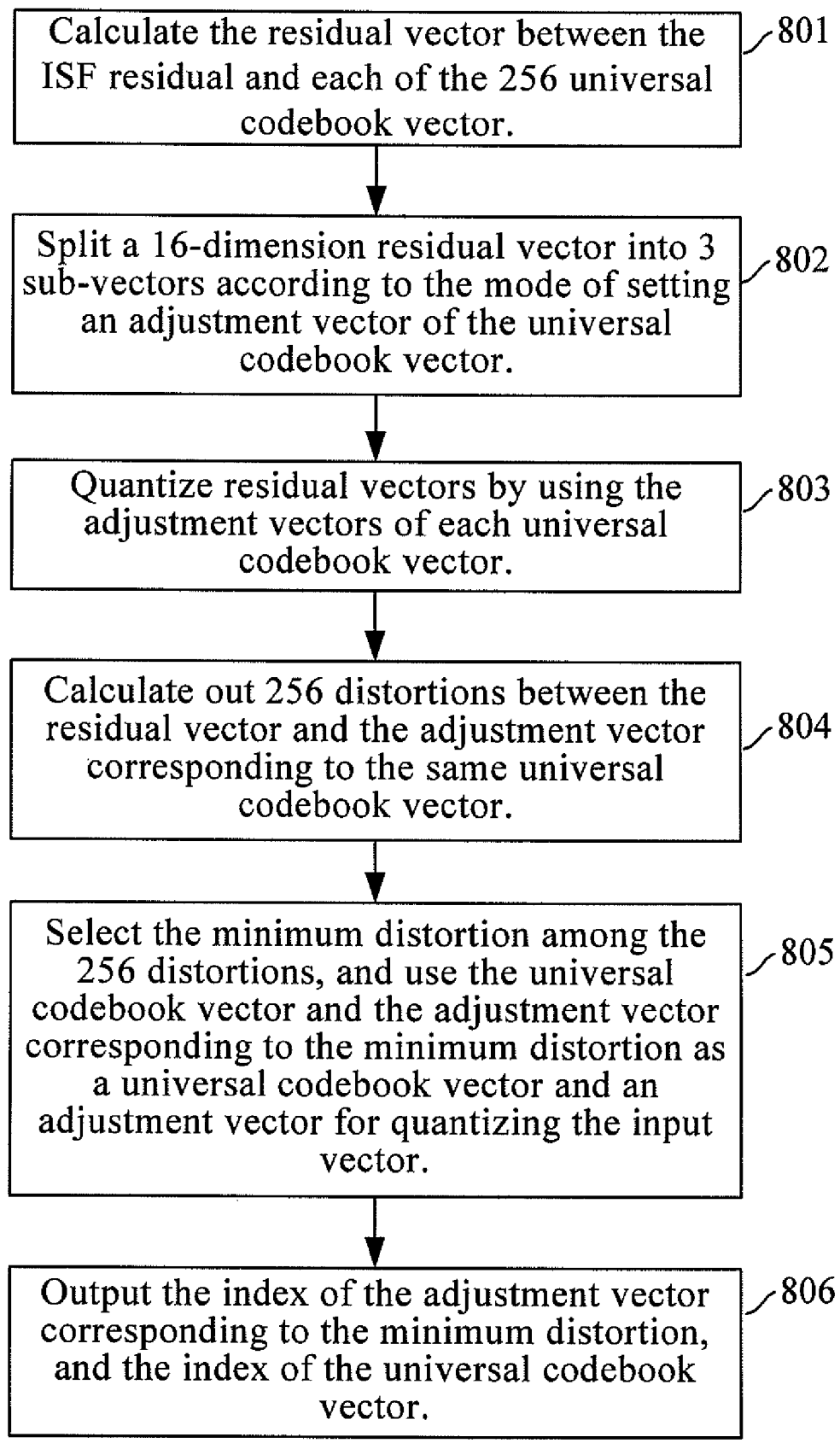
FIG. 8 is a flow chart of quantizing ISF residues through the vector quantization method in one embodiment.

Based on the ISF residual codebook vectors and the adjustment vector of each codebook vector illustrated in FIG. 7, FIG. 8 shows the process of quantizing ISF residues through the vector quantization method in an embodiment of the present invention, where N codebook vectors and the adjustment vector of each codebook vector are used to quantize the vector. The process of quantizing the codebook vectors of the vector to be quantized and the adjustment vectors includes the following actacts:

ActAct 801: Calculate the residual vector between each codebook vector and the adjustment vector of this codebook vector among the vector to be quantized and the 256 codebook vectors.

In this embodiment, the vector to be quantized is an ISF residual. The calculation of the residual vector between each codebook vector and the adjustment vector of this codebook vector among the vector to be quantized and the 256 codebook vectors is equivalent to calculation of the residual vector between the codebook vectors among the ISF residues and the 256 codebook vectors.

In this actact, the obtained residual vectors are also 16-dimension vectors. There are 256 residual vectors, which are expressed as $res_{j,i}$, j=1, 2, ..., 256, i=1, 2, ..., 16.

ActAct 802: Split a 16-dimension residual vector into 3 sub-vectors according to the mode of setting an adjustment vector of the codebook vector.

In this embodiment, the 16-dimension residual vector corresponding to codebook vector j is split into 3 sub-vectors according to the adjustment vector corresponding to the components on dimensions 1-6, the adjustment vector corresponding to the components on dimensions 7-13, and the adjustment vector corresponding to the components on dimensions 14-16 as described in actact 705. The three sub-vectors are:

$res_{j,i}$, i=1, 2, . . . , 6; $res_{j,i}$, i=7, . . . , 13; $res_{j,i}$, i=14, . . . , 16.

ActAct 803: Quantizing residual vectors by using the adjustment vectors of each codebook vector.

In this embodiment, the process of quantizing a vector through N codebook vectors and the adjustment vector of each codebook vector includes using the adjustment vector of each codebook vector to quantize the residues between the vector to be quantized and the codebook vector. The process of quantizing a residual vector includes calculating the absolute residual between the component on each dimension of the residual vector and each adjustment vector of the component on the same dimension of the codebook vector; selecting the minimum absolute residual corresponding to the component of each dimension of the residual vector and the index of the corresponding adjustment vector. Taking the quantization of $res_{j,i}$, i=1, 2, . . . , 6 as an example, the quantization process is detailed below:

Calculate the absolute residual between the component on the first dimension of $res_{j,i}$ and each element in the collection V(i,k), i=1, k=1, 2, . . . , 7:

$$E_{1,k} = |res_{j,1} - V(l,k)|,$$

$$V(l,k) = \{0, AVS(j) \times A_1, -AVS(j) \times A_1, AVS(j) \times B1, -AVS(j) \times B_1, AVS(j) \times C_1, -AVS(j) \times C_1\}.$$

Obtain seven absolute residues represented by $E_{l,k}$, and select the minimum absolute residual min $E_{l,k}$, and record the corresponding k value.

According to the foregoing quantization process, work out the minimum absolute residual min $E_{i,k}$ (i=1, 2, . . . , 6) on dimensions 1-6 in the $res_{j,i}$; work out the minimum absolute residual min $E_{i,k'}$ (i=7, . . . , 13) on dimensions 7-13; and work out the minimum absolute residual min $E_{i,k'}$ (i=14, . . . , 16) on dimensions 14-16.

ActAct 804: Calculate the distortion between each residual vector and the adjustment vector corresponding to the minimum absolute residual, and obtain N distortions.

In this embodiment, the process of calculating the distortion between each residual vector and the adjustment vector corresponding to the minimum absolute residual includes, for each of the 256 residual vectors, working out the square value of the minimum absolute residual corresponding to the component on each dimension of the residual vector, and then summing up the square values of the minimum absolute residues corresponding to the components on each dimension; using the sum as distortion between the residual vector and the adjustment vector corresponding to the same codebook vector; each residual vector corresponds to a distortion, and obtaining N distortions. Take the calculation of distortion $E_j$ between $res_{j,i}$ (i=1, 2, . . . , 16) and the adjustment vector as an example, the formula is:

$$E_j = \sum_{i=1}^{6}(minE_{i,k})^2 + \sum_{i=7}^{13}(minE_{i,k'})^2 + \sum_{i=14}^{16}(minE_{i,k'})^2,$$

$$j = 1, 2, \ldots, 256$$

Thus 256 distortions can be obtained.

Suppose $$E1 = \sum_{i=1}^{6}(minE_{i,k})^2, E2 = \sum_{i=7}^{13}(minE_{i,k'})^2 \text{ and } E3 = \sum_{i=14}^{16}(minE_{i,k'})^2,$$

then E1, E2 and E3 may be weighted, considering that the ISF residual is sensitive to errors to different extents. The square value is multiplied by the corresponding weight coefficient to obtain a weighted distortion, $E_j = E1 + E2/\alpha + E3/\beta$, where $\alpha$ and $\beta$ are weight coefficients, and are real numbers.

ActAct 805: Select the minimum distortion among the 256 distortions, and use the codebook vector and the adjustment vector corresponding to the minimum distortion as a codebook vector and an adjustment vector for quantizing the vector.

In this embodiment, suppose that the minimum distortion is $E_j = E1 + E2/\alpha + E3/\beta$, then codebook vector j is the codebook vector for quantizing the vector, and is the best codebook vector. Suppose that k corresponds to the first min $E_{l,k}$ in the E1 is 2, the quantization adjustment vector on the first dimension of the residual vector is AVS(j)×$A_1$, and is the best adjustment vector on the first dimension of residual vector. By analogy, the best adjustment vector on dimensions 1-6 of the residual vector can be obtained according to E1; the best adjustment vector on dimensions 7-13 of the residual vector can be obtained according to E2; the best adjustment vector on dimensions 14-16 of the residual vector can be obtained according to E3; the best adjustment vector on dimensions 1-6 of the residual vector and the corresponding k value are obtained, and the quantization adjustment vector on dimensions 14-16 and the corresponding k' are obtained.

ActAct 806: Output the index of the adjustment vector corresponding to the minimum distortion, and the index of the codebook vector.

In this embodiment, after $E_j$ is obtained, codebook vector j corresponding to $E_j$ is the best codebook vector, whose index is j. As mentioned in act 805, the index of the quantization adjustment vector on the first dimension of the residual vector is k=2, which corresponds to the first min $E_{l,k}$ obtained according to E1. By analogy, the index of the best adjustment vector of the component on each dimension of the residual vector is obtained.

The process of quantizing ISF residues through the vector quantization method may be completed. Afterward, the ultimately obtained index is transferred to the decoder as an encoding result. According to the codec protocol, the decoder finds the quantization vector corresponding to the vector to be quantized in view of the index, and obtains assembled voice signals.

It should be noted that in act 801, it is appropriate to sum up the components on each dimension of each codebook vector and the adjustment vectors corresponding to the components on this dimension first, and then calculate the absolute residual between each sum value and the component on the same dimension of the vector to be quantized. In this way, the absolute residual mentioned in act 803 is obtained directly before subsequent operations in act 803.

In the process of encoding image/video signals, the signals can be sampled to obtain signal sequences, and such sequences may make up vectors. Therefore, the vector quantization method is also applicable to the process of encoding image/video signals.

The vector quantizer 10 is detailed below.

Figure 9:
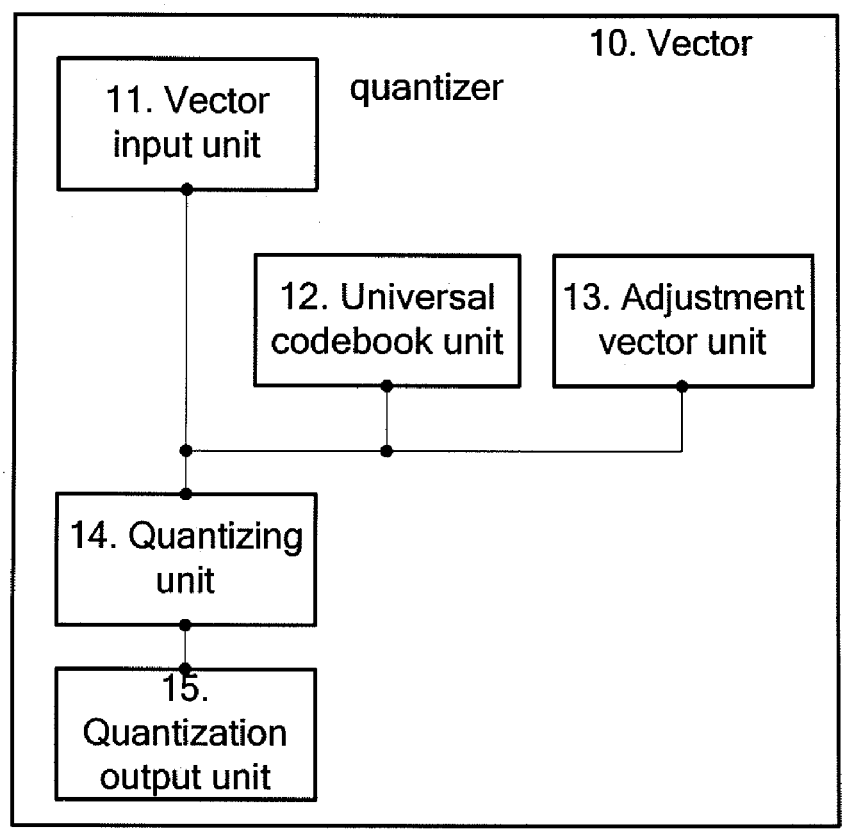
FIG. 9 shows the logic structure of a vector quantizer according to the fifth embodiment.

A vector quantizer 10 shown in FIG. 9 includes: a vector input unit 11, adapted to obtain the vector to be quantized; a basic codebook unit 12, adapted to provide a basic codebook vector having several basic sub-vectors; among the several basic sub-vectors, at least one K-dimension (K≧2) basic sub-vector corresponds to an adjustment vector collection; the adjustment vector collection includes N adjustment vectors (N=1, 2, 3 and so on) of K dimension; at least one adjustment vector collection meets the requirement that N is less than the quantity of all possible combinations of different values of each dimension of all adjustment vectors in the adjustment vector collection; an adjustment vector unit 13, adapted to provide an adjustment vector corresponding to the basic sub-vector in a basic codebook vector provided by the basic codebook unit 12; a quantizing unit 14, adapted to obtain a basic codebook vector and an adjustment vector from the basic codebook unit 12 and the adjustment vector unit 13, regard a combination of a basic codebook vector and one or more adjustment vectors corresponding to different basic sub-sectors as a joint codebook vector, and select a joint codebook vector for quantization among the possible joint codebook vectors according to the deviation between the joint codebook vector and the vector obtained by the vector input unit 11; and a quantization output unit 15, adapted to obtain an index of the basic codebook vector corresponding to the joint codebook vector selected by the quantizing unit 14, and an index of the adjustment vector.

Figure 10:
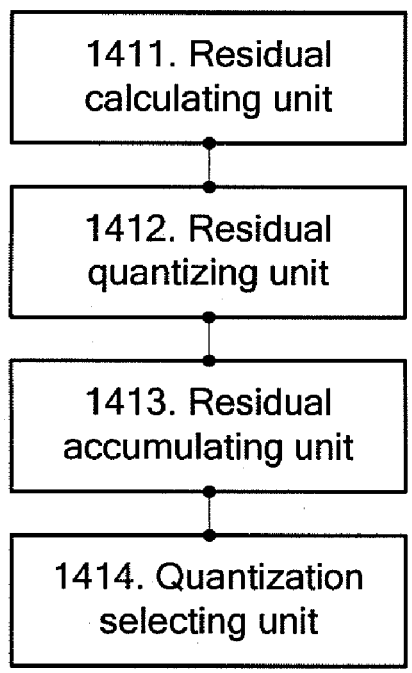
FIG. 10 shows the logic structure of a quantizing unit according to the fifth embodiment.

Corresponding to method 1 of searching joint codebook vectors in the first embodiment, the quantizing unit in this embodiment may be in a structure shown in FIG. 10, including:

a residual calculating unit 1411, adapted to calculate the residual vector between the vector to be quantized and the current basic codebook vector obtained from the basic codebook unit; the residual vector has one or more residual sub-vectors, and the way of dividing into residual sub-vectors is the same as the way of dividing into basic sub-vectors;

a residual quantizing unit 1412, adapted to, for a basic sub-vector corresponding to an adjustment vector collection, select the best adjustment vector of the current basic sub-vector according to the deviation between the adjustment vector in the adjustment vector collection provided by the adjustment vector unit and the corresponding residual sub-vector obtained by the residual calculating unit 1411;

a deviation accumulating unit 1413, adapted to accumulate the deviation of all the best adjustment vectors obtained by the residual quantizing unit 1412, and the deviation between the basic sub-vector not corresponding to the adjustment vector collection and the vector to be quantized, and use such a deviation as the deviation of the best joint codebook vector corresponding to the current basic codebook vector; and a quantization selecting unit 1414, adapted to compare the deviation of the best joint codebook vector corresponding to each basic codebook vector obtained by the deviation accumulating unit 1413, and select a joint codebook vector for quantization.

Figure 11:
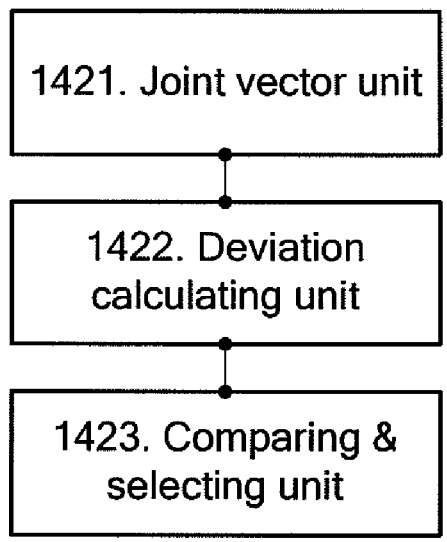
FIG. 11 shows another logic structure of a quantizing unit according to the fifth embodiment.

Corresponding to method 2 of searching joint codebook vectors in the first embodiment, the quantizing unit in this embodiment may be in a structure shown in FIG. 11, including:

a joint vector unit 1421, adapted to add up the current basic codebook vector obtained from the basic codebook unit and the adjustment vector obtained from the adjustment vector unit to form a joint codebook vector;

a deviation calculating unit 1422, adapted to calculate the deviation between the joint codebook vector currently generated by the joint vector unit 1421 and the vector to be quantized; and a comparing and selecting unit 1423, adapted to compare the deviation between each different joint codebook vector obtained by the deviation calculating unit 1422 and the vector to be quantized and select a joint codebook vector for quantization.

The vector quantizer in this embodiment may serve to implement the vector quantization method described in the first embodiment.

Embodiment 6

Figure 12:
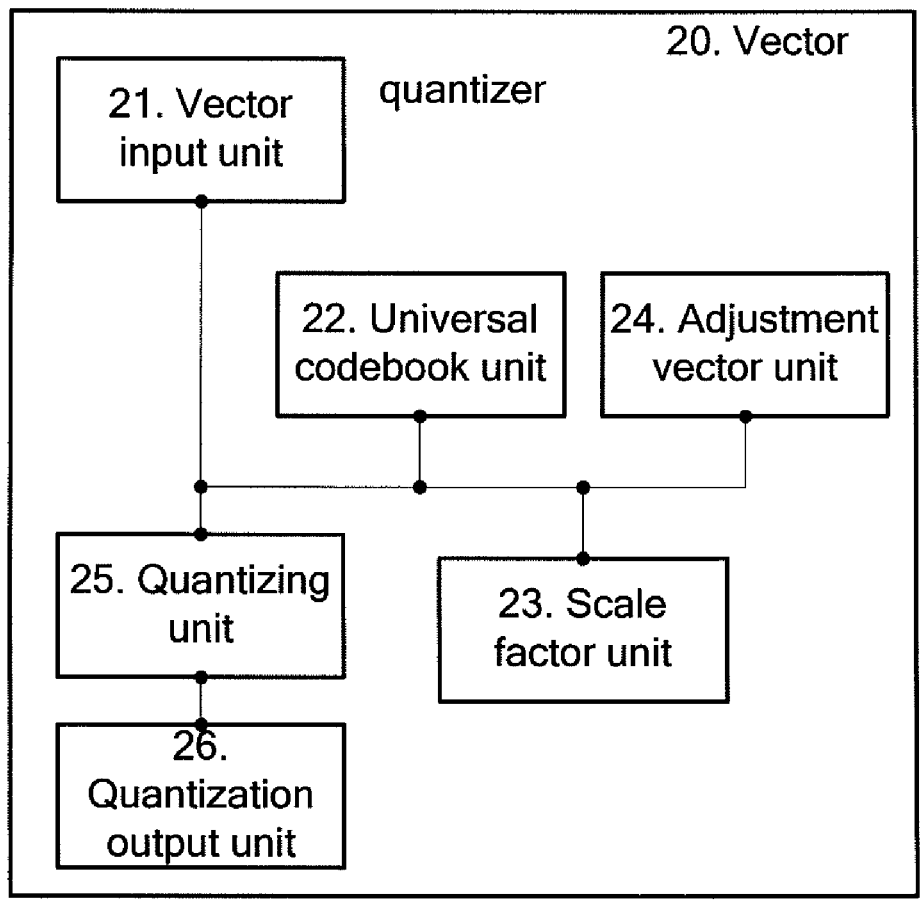
FIG. 12 shows the logic structure of a vector quantizer according to the sixth embodiment.

A vector quantizer 20 shown in FIG. 12 includes:

a vector input unit 21, adapted to obtain the vector to be quantized;

a basic codebook unit 22, adapted to provide a basic codebook vector having several basic sub-vectors; among the several basic sub-vectors, at least one K-dimension (K≧2) basic sub-vector corresponds to an adjustment vector collection; the adjustment vector collection includes N adjustment vectors (N=1, 2, 3 and so on) of K dimension; at least one adjustment vector collection meets the requirement that N is less than the quantity of all possible combinations of different values of each dimension of all adjustment vectors in the adjustment vector collection;

a scale factor unit 23, adapted to provide a scale factor corresponding to the basic codebook vector currently provided by the basic codebook unit 22;

an adjustment vector unit 24, adapted to provide an adjustment vector corresponding to the basic sub-vector in the basic codebook vector provided by the basic codebook unit 22, the adjustment vector is a product of the adjustment coefficient vector corresponding to the basic sub-vector and the scale factor provided by the scale factor unit 23;

a quantizing unit 25, adapted to obtain a basic codebook vector and an adjustment vector from the basic codebook unit 22 and the adjustment vector unit 24, regard a combination of a basic codebook vector and one or more adjustment vectors corresponding to different basic sub-sectors as a joint codebook vector, and select a joint codebook vector for quantization among the possible joint codebook vectors according to the deviation between the joint codebook vector and the vector to be quantized; and a quantization output unit 26, adapted to obtain an index of the basic codebook vector corresponding to the joint codebook vector selected by the quantizing unit 24, and an index of the adjustment vector.

The vector quantizer in this embodiment may serve to implement the vector quantization method described in the second embodiment.

Embodiment 7

Figure 13:
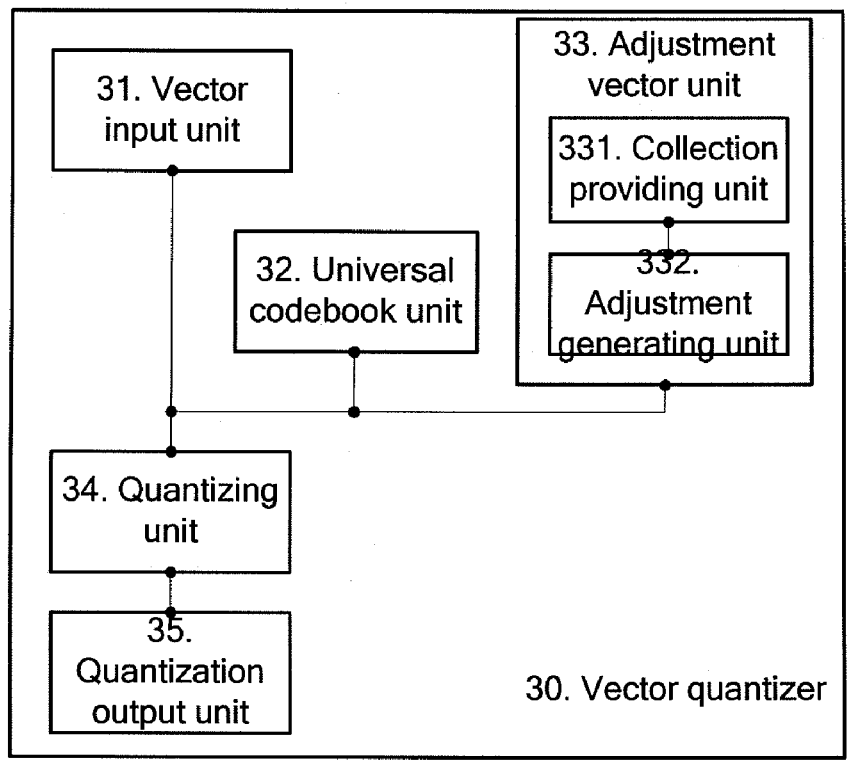
FIG. 13 shows the logic structure of a vector quantizer according to the seventh embodiment.

A vector quantizer 30 shown in FIG. 13 includes:

a vector input unit 31, adapted to obtain the vector to be quantized;

a basic codebook unit 32, adapted to provide a basic codebook vector having several basic sub-vectors; among the several basic sub-vectors, at least one K-dimension (K≧2) basic sub-vector corresponds to an adjustment vector collection;

the adjustment vector collection includes N adjustment vectors (N=1, 2, 3 and so on) of K dimension; at least one adjustment vector collection meets the requirement that N is less than the quantity of all possible combinations of different values of each dimension of all adjustment vectors in the adjustment vector collection;

an adjustment vector unit 33 includes:

a collection providing unit 331, adapted to provide a relation vector collection corresponding to the basic sub-vector provided by the basic codebook unit 32; the relation vector collection is an adjustment vector collection or is in a function relation with the adjustment vector collection;

an adjustment generating unit 332, adapted to search for the relation vector collection provided by the collection providing unit 331 and obtain the corresponding adjustment vector according to the relation vector obtained from the relation vector collection;

a quantizing unit 34, adapted to obtain a basic codebook vector and an adjustment vector from the basic codebook unit 32 and the adjustment vector unit 33, regard a combination of a basic codebook vector and one or more adjustment vectors corresponding to different basic sub-sectors as a joint codebook vector, and select a joint codebook vector for quantization among the possible joint codebook vectors according to the deviation between the joint codebook vector and the vector to be quantized; and a quantization output unit 35, adapted to obtain an index of the basic codebook vector corresponding to the joint codebook vector selected by the quantizing unit 34, and an index of the adjustment vector; this index is a sequence number of the relation vector corresponding to the adjustment vector in the relation vector collection.

The vector quantizer in this embodiment may serve to implement the vector quantization method described in the third embodiment.

Embodiment 8

Figure 14:
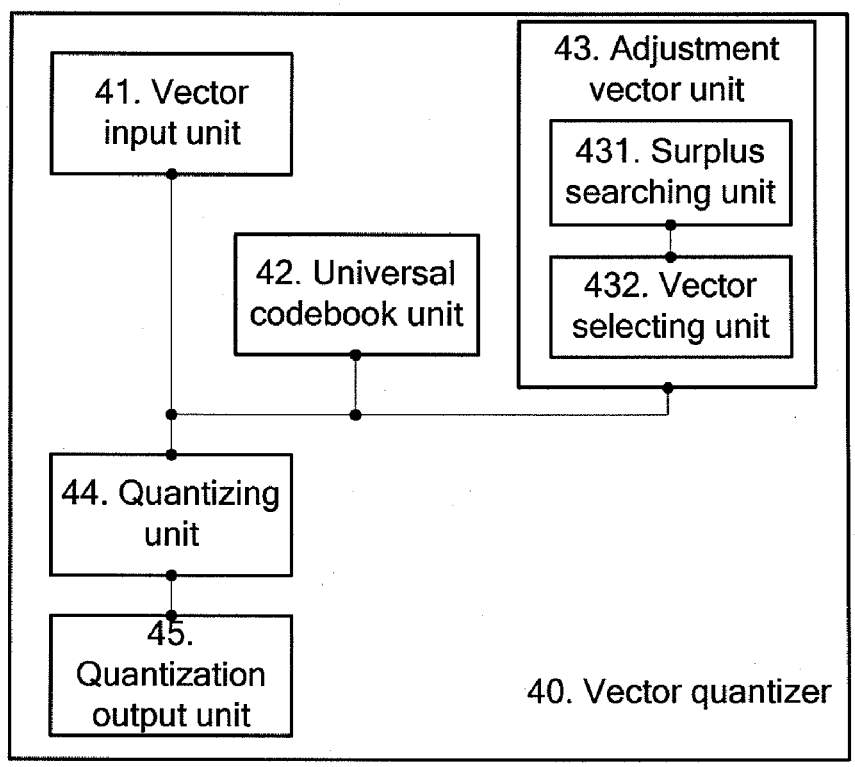
FIG. 14 shows the logic structure of a vector quantizer according to the eighth embodiment.

A vector quantizer 40 shown in FIG. 14 includes:

a vector input unit 41, adapted to obtain the vector to be quantized; and a basic codebook unit 42, adapted to provide a basic codebook vector having several basic sub-vectors; among the several basic sub-vectors, at least one K-dimension (K≧2) basic sub-vector corresponds to an adjustment vector collection; the adjustment vector collection includes N adjustment vectors (N=1, 2, 3 and so on) of K dimension; at least one adjustment vector collection meets the requirement that N is less than the quantity of all possible combinations of different values of each dimension of all adjustment vectors in the adjustment vector collection;

an adjustment vector unit 43 includes:

a surplus searching unit 431, adapted to search for all possible combinations of different values on each dimension of the relation vector corresponding to the basic sub-vector provided by the basic codebook unit 42;

a vector selecting unit 432, adapted to judge whether the combination of values on each dimension currently obtained by the surplus searching unit 431 is a selectable valid relation vector; if so, obtain the adjustment vector according to the currently obtained valid relation vector; if not, control the surplus searching unit 431 to go on searching until the search succeeds;

a quantizing unit 44, adapted to obtain a basic codebook vector and an adjustment vector from the basic codebook unit 42 and the adjustment vector unit 43, regard a combination of a basic codebook vector and one or more adjustment vectors corresponding to different basic sub-sectors as a joint codebook vector, and select a joint codebook vector for quantization among the possible joint codebook vectors according to the deviation between the joint codebook vector and the vector to be quantized; and a quantization output unit 45, adapted to obtain an index of the basic codebook vector corresponding to the joint codebook vector selected by the quantizing unit 44, and an index of the adjustment vector; this index is a sequence number of the valid relation vector corresponding to the adjustment vector among all the valid relation vectors.

The vector quantizer in this embodiment may serve to implement the vector quantization method described in the fourth embodiment.

The structure of the adjustment vector unit in embodiments 7 and 8 above is also applicable to embodiments 5 and 6.

The foregoing embodiment reveals that, the vector is quantized through a joint codebook vector composed of a basic codebook vector and the adjustment vector of its sub-vector, because the basic codebook vector is adjusted through an adjustment vector, the dynamic range of the basic codebook vector is broadened effectively and the distortion of the basic codebook vector is reduced. As a result, the effect of one-stage quantization is equivalent to or better than the effect of multi-stage quantization, and the codebook storage load and the quantization calculation load are reduced effectively. Moreover, the basic codebook vector is adjusted through an adjustment vector so that the adjustment vector may be designed by making the most of the relevance which still exists between certain dimensions after the vector to be quantized subtracts the basic codebook vector. As a result, less adjustment vectors can implement adjustment in a wider dynamic adjustment range. Meanwhile, the relevance used between dimensions reduces adjustment vectors, and decreases the calculation load for quantization. Subsequently, a product of a scale factor and the adjustment coefficient vector is used to obtain an adjustment vector. Because the value of an adjustment vector is related to a specific $U_a$, different basic codebook vectors ($U_a$) derive different adjustment vector collections through the same adjustment coefficient vector collection. Therefore, the effect of adjustment is better, and the dynamic range of the adjustment vector is widened effectively. Subsequently, an adjustment vector is obtained by searching the relation vector collection directly, which requires only a low calculation load. If the subdivided sub-collections are used to search the relation vector collection, the relation vectors may be stored in each sub-collection. Each sub-collection provides various combinations of all values of each dimension. Therefore, only the values of each dimension need to be stored instead of storing the combination modes, thus reducing the storage load. Subsequently, a surplus search mode is used to obtain the relation vector, and obtain the corresponding adjustment vector by judging the validity of the combination. As a result, the storage load is reduced because it is not necessary to store the actual combination relations of the valid relation vectors.

In order to clarify the benefits of the embodiments, the performance parameters are compared below between the method the present embodiments and the ITU-T G.VBR baseline encoder method in the process of quantizing 16-dimension ISF vectors of broadband non-voice signals. (The vector quantization method used by the ITU-T G.VBR baseline encoder for broadband non-voice signals is similar to the MSVQ in AMR-WB+ except that no vector splitting is performed in the multi-stage quantization process.) The "quantization effect" item is a result of comprehensive statistics on 25 types of voices provided by NTT and 2112 voice materials after quantization of non-voice ISF coefficients of 405336 frames.

(i) ITU-T G.VBR Baseline Encoder Method
Basic Settings:
1. Performing 8-stage quantization.
2. In the first stage of quantization, selecting 5 preferred codebooks from grade-1 codebooks according to the weighted mean square error, using 64 16-dimension grade-1 codebooks in total.
3. For each preferred codebook, using codebook vectors of grades 2-8 to quantize the residues of the upper-grade quantization, and selecting the final quantization result from 5 groups of results. The quantity of 16-dimension codebooks used by grades 2-8 is: 32, 16, 64, 64, 32, 32, and 8 respectively.

Performance Parameters:
1. Quantity of encoding bits: 6+5+4+6+6+5+5+3=40 bits.
2. Storage load: 16*(64+32+16+64+64+32+32+8)=4992 floating points.
3. Calculation load: about 21000 operations of adding and subtracting, and about 42000 operations of multiplying.
4. Quantization effect: average spectrum distortion: 0.975 dB; distortion of 2.0-4.0 dB accounts for 0.919% of the total; distortion of greater than 4.0 dB accounts for 0.00715%.

(ii) Technical Solution
Basic Settings:
1. Using 57 16-dimension basic codebook vectors (divided into 5 basic sub-vectors).
2. Each basic codebook vector corresponds to a scale factor.
3. The first basic codebook vector includes dimensions 1-2, and each dimension has 7 independently varying adjustment vectors.
4. Basic sub-vectors 2-5 includes dimensions 3-5, dimensions 6-8, dimensions 9-12, and dimensions 13-16. Each of basic sub-vectors 2-5 corresponds to an adjustment vector collection respectively. Each adjustment vector collection is divided into 3 sub-collections, and each dimension of each sub-collection has 3 independently varying adjustment vectors.

Performance Parameters:
1. Encoding bits: 40 bits. The total number of combinations is 57*7*7*(3*3*3*3)*(3*3*3*3)*(3*3*3*3)*(3*3*3*3)=1082065425777, and 40 bits allow for 2^40=1099511627776 combinations. Therefore, 40 bits are applicable for encoding.
2. Storage load: 16*57+57+7*2+14*3*3=1109 floating points.
3. Calculation load: about 25000 operations of adding and subtracting, and about 7500 operations of multiplying.
4. Quantization effect: average spectrum distortion: 0.943 dB; distortion of 2.0-4.0 dB accounts for 1.031% of the total; distortion of greater than 4.0 dB accounts for 0.0054%.

The performance parameters of the two methods reveal that, with the same quantity of bits to be encoded, the method under the present embodiments is better than the ITU-T G.VBR baseline encoder method with respect to storage load, calculation complexity, and quantization effect.

Figure 15:
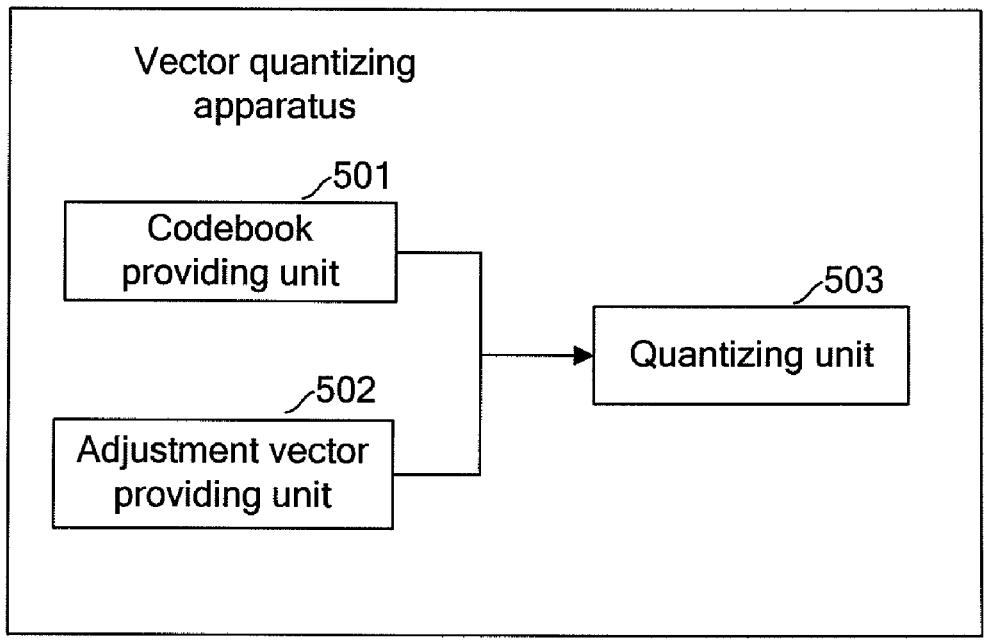
FIG. 15 shows the structure of a vector quantization apparatus in one embodiment.

In one embodiment, an apparatus for vector quantization based on the first vector quantization method provided in the foregoing embodiments is provided. FIG. 15 shows the structure of a vector quantization apparatus in a preferred embodiment. The apparatus includes:

a codebook vector providing unit, adapted to transfer N (N=1, 2, 3 and so on) codebook vectors corresponding to a vector to be quantized to a quantizing unit;

an adjustment vector providing unit, adapted to transfer an adjustment vector of each codebook vector to a quantizing unit; and a quantizing unit, adapted to receive the adjustment vectors of each codebook from the adjustment vector providing unit, and from the codebook providing unit, perform a quantization process on a vector to be quantized by use of N codebooks and the adjustment vectors of each codebooks, and obtain codebooks and adjustment vectors for quantizing the vector to be quantized.

The N codebook vectors and the adjustment vector of each codebook vector may be generated before vector quantization. Therefore, in the vector quantization process, the codebook vectors and the adjustment vectors required for vector quantization may be transferred to the quantizing unit 503 through the codebook vector providing unit 501 and the adjustment vector providing unit 502.

Figure 16:
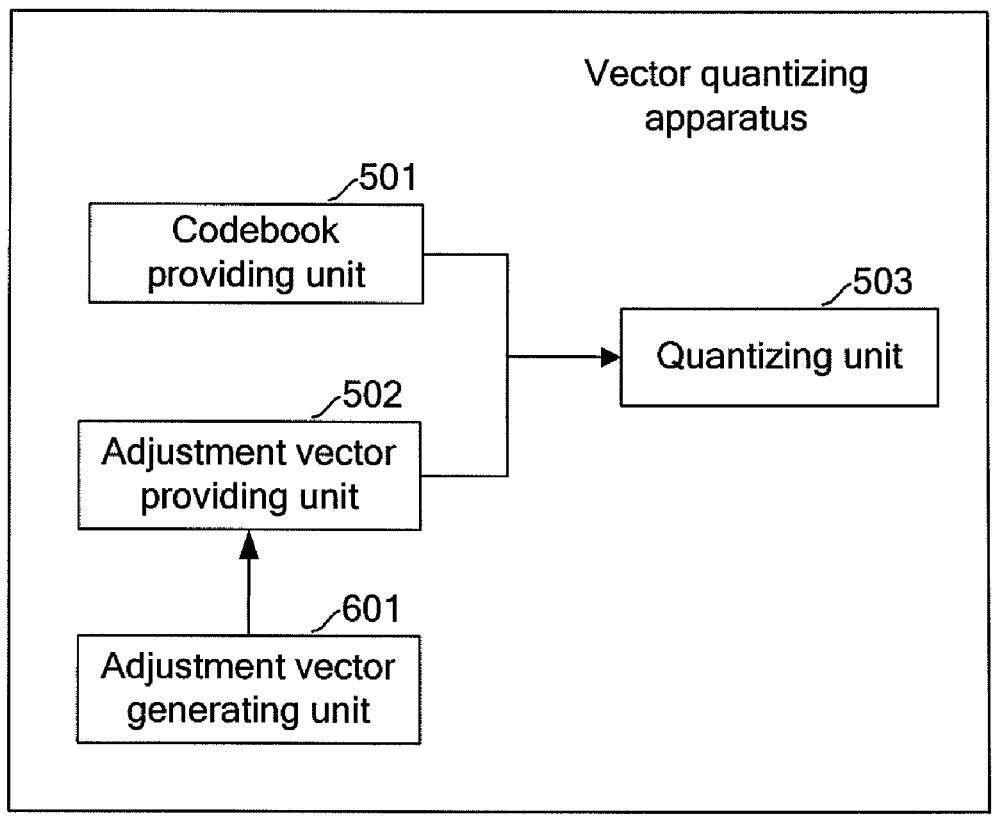
FIG. 16 shows the structure of a vector quantization apparatus in one embodiment.

FIG. 16 shows a vector quantization apparatus in another embodiment. The apparatus further includes an adjustment vector generating unit, adapted to calculate the average vector of N codebook vectors (N=1, 2, 3 and so on), calculate the distance from each codebook vector to the average vector. According to the distance form each codebook vector to the average vector, generate one or more adjustment vectors of each codebook vector, and transfer the generated adjustment vectors of each codebook vector to the adjustment vector providing unit.

Figure 17:
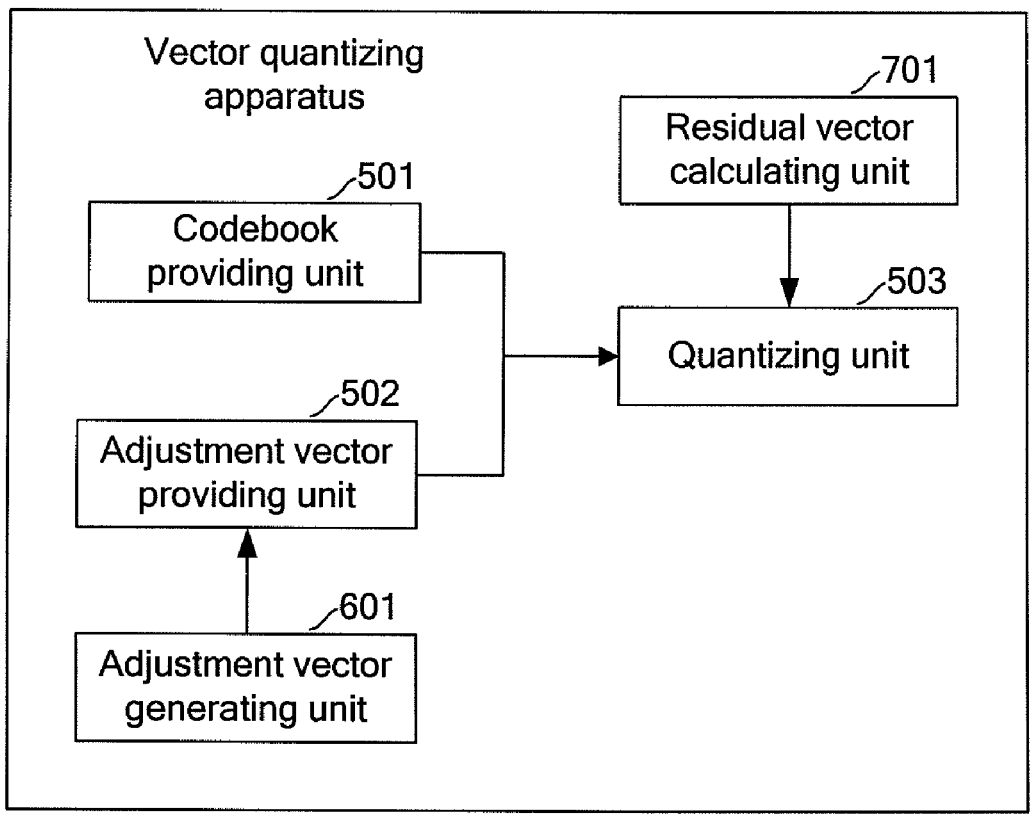
FIG. 17 shows the structure of a vector quantization apparatus in one embodiment.

FIG. 17 shows the structure of a vector quantization apparatus in another embodiment. Based on the apparatus shown in FIG. 16, this apparatus may further include: a residual vector calculating unit, adapted to calculate the residual vector between the vector to be quantized and each of N codebook vectors, and transfer the residual vector to the quantizing unit.

Figure 18:
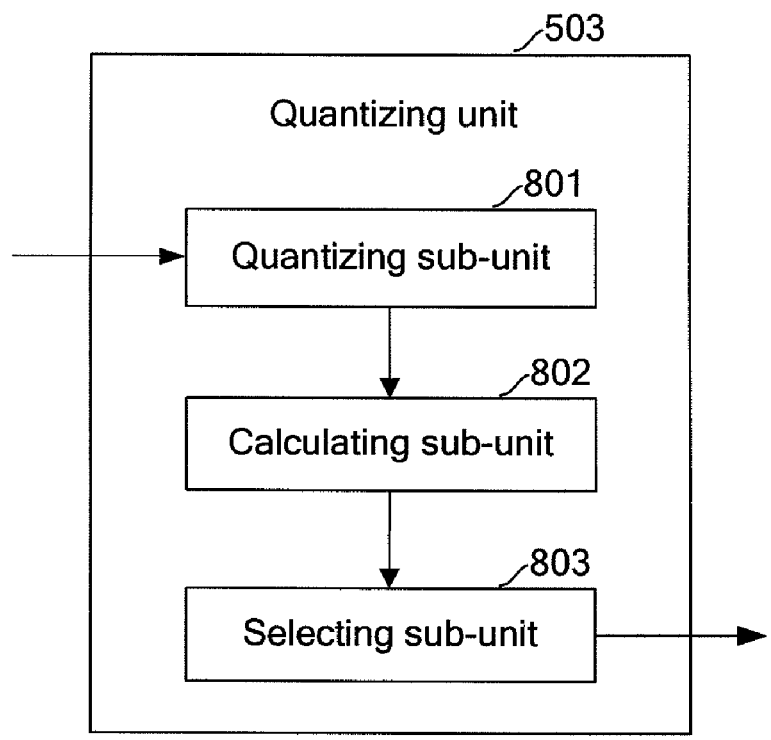
FIG. 18 shows the structure of a quantizing unit in FIG. 7 according to one embodiment.

FIG. 18 is a preferred embodiment of the quantizing unit shown in FIG. 17. The quantizing unit includes:

a quantizing sub-unit, adapted to receive the adjustment vector of each codebook vector from the adjustment vector providing unit, and the residual vector from residual vector calculating unit, calculate the absolute residual between the component on each dimension of the each residual vector and each adjustment vector of the component on the same dimension of the corresponding codebook vector, select the minimum absolute residual corresponding to the component on each dimension of the residual vector, and transfer the calculation result of the minimum absolute residual corresponding to the component on each dimension of the residual vector to a calculating sub-unit;

a calculating sub-unit, adapted to receive the calculation result of the minimum absolute residual corresponding to the component on each dimension of each residual vector from the quantizing sub-unit, calculate the square value of the minimum absolute residual corresponding to the component on each dimension of the residual vector, sum up the square values of the minimum absolute residues corresponding to the components on each dimension, calculate N distortions of N residual vectors by using the sum-up result as distortion between the residual vector and the adjustment vector, and transfer N distortions to the selecting sub-unit; and a selecting sub-unit, adapted to receive N distortions from the calculating sub-unit, select the minimum distortion, and the codebook vectors and adjustment vectors corresponding to the minimum distortion, and output the codebook vectors and adjustment vectors corresponding to the minimum distortion.

Figure 19:
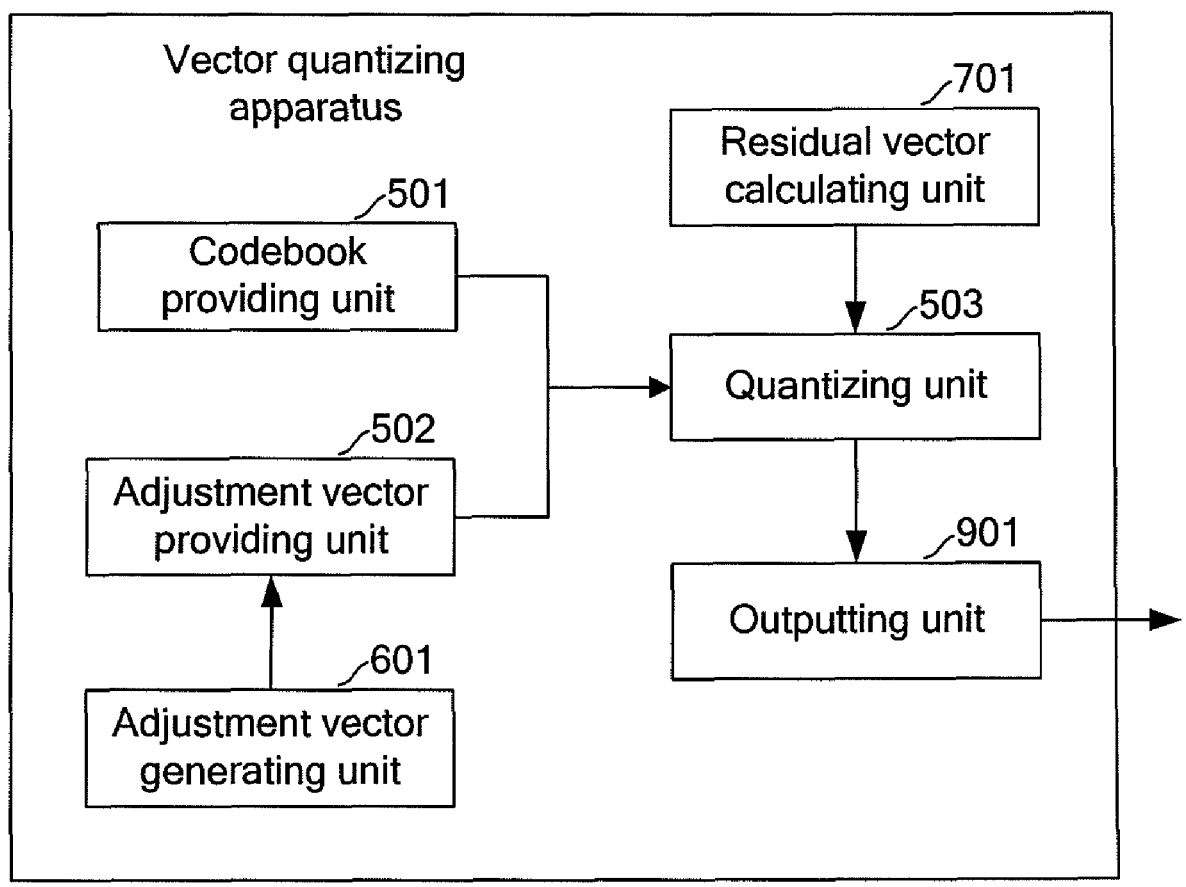
FIG. 19 shows the structure of a vector quantization apparatus in another embodiment.

FIG. 19 shows the structure of a vector quantization apparatus in another preferred embodiment. Based on the apparatus shown in FIG. 17, this apparatus further includes: an output unit, adapted to receive the codebook vectors and adjustment vectors corresponding to the minimum distortion from the selecting sub-unit, and output the index of the codebook vector corresponding to the minimum distortion and the index of the adjustment vector corresponding to the minimum distortion.

In order to further inspect the performance of the vector quantization method shown in FIG. 5, the voice quality is evaluated and compared between the AMR-WB+ method and the method under the present embodiments objectively. The evaluation software is the ITU-T P.862 WideBand Perceptual Evaluation of Speech Quality (WB-PESQ). The evaluated parameters include average spectrum distortion. The test sequences are AMR-WB+ test sequences provided by the $3^{rd}$ Generation Partnership Project (3GPP) and test sequences provided by the Advanced Video coding Standard (AVS), and are composed of 71 test sequences, including audio, music, music with voice background, and voice with music background. The test results are as follows:

1. The average score of Perceptual Evaluation of Speech Quality (PESQ) is 3.801 for the AMR-WB+ method, and is 3.874 for the method under the present embodiments. Among 142 test items in 71 test sequences for 2 bit rates (10.4 Kbps and 24 Kbps), 47 items are in favor of the AMR-WB+ method and 95 items are in favor of the technical solution (as indicated by the highest score of PESQ).

2. The average spectrum distortion of the AMR-WB+ method is 0.960156, where distortion of 2 dB-4 dB accounts for 3.84% and distortion greater than 4 dB accounts for 0.095%; the average spectrum distortion of the method under the present embodiments is 0.878902, where distortion of 2 dB-4 dB accounts for 0.963% and distortion greater than 4 dB accounts for 0.00158%.

As shown in Table 1, the grade-1 quantization of the AMR-WB+ vector quantization solution involves 256 and 256 codebook vectors, and a storage load of 256×(9+7)=4096 floating points; the grade-2 quantization involves 64, 128, 128, 32, and 32 codebook vectors respectively, and a storage load of 64×3+128×3+128×3+32×3+32×4=1184 floating points, hence involving a total storage load of 4096+1184=5280 floating points. The corresponding multiplication operation load is that for grade-1 quantization, 256 codebook vectors are searched out through traversal, and 4 best grade-1 codebook vectors are searched out of them; subsequently, grade-2 codebook vectors are searched out by traversing 4 best grade-1 codebook vectors and grade-2 quantized 64, 128, 128, 32, and 32 code vectors respectively.

Compared with the AMR-WB+ vector quantization solution, the vector quantization method under the present embodiments for quantizing the ISF residues uses 8 bits to encode 256 codebook vectors; and uses 38 bits to encode the adjustment vectors of the codebook vectors. As regards storage load, 256 codebook vectors need to be stored (256×16=4096 floating points) in the embodiment of the present embodiments; with the base value of the 256 adjustment vectors, the total storage load is 4096+256=4352 floating points. The calculation load is multiplication operation required for traversing 256 codebook vectors.

Therefore, the technical solution provided in an embodiment of the present embodiments is obviously superior with respect to encoding quality and vector quantization complexity.

In the final analysis, the technical solution under the present embodiments quantizes vectors by using the codebook vectors corresponding to the vectors to be quantized, and the adjustment vectors of such codebook vectors; uses joint calculation to find the best codebook vectors corresponding to the best adjustment vectors while finding the best adjustment vectors, thus minimizing the distortion of the whole quantization process and ensuring high encoding quality. The best adjustment vector is the adjustment vector corresponding to the minimum distortion, and the best codebook vector is the codebook vector corresponding to the best adjustment vector. Meanwhile, the technical solution provided in an embodiment of the present embodiments uses the adjustment vector of the codebook vectors to quantize the residual vector between the codebook vector and the vector to be quantized, which is different from the practice of quantizing the residual vector through multi-stage codebook vectors in the prior art. Therefore, the codebook vector storage load is reduced, the computation load is only the calculation load required for traversing N codebook vectors. Considering that the prior art needs to traverse multiple stage-2 codebook vectors after traversing N stage-1 codebook vectors, the method under the present embodiments reduces the calculation load. The technical solution provided in an embodiment of the present invention reduces the complexity of vector quantization while ensuring high encoding quality.

The preceding describes a method and an apparatus for vector quantization according to embodiments of the present invention. Although the invention is described through some exemplary embodiments, the invention is not limited to such embodiments. It is apparent that those skilled in the art can make various modifications and variations to the invention without departing from the spirit and scope of the invention. The invention shall cover the modifications and variations provided that they fall in the scope of protection defined by the following claims or their equivalents.

What is claimed is:

1. A method for vector quantization comprising:

performing, by a hardware processor, a quantization process on a vector to be quantized by use of N basic codebook vectors and adjustment vectors of the N basic codebook vectors;

generating a basic codebook vector and an adjustment vector used for quantizing the vectors to be quantized;

combining the basic codebook vector and the adjustment vector to different basic sub-vectors as a joint codebook vector; and selecting a joint codebook vector for quantization among possible joint codebook vectors according to the deviation between the joint codebook vector and the vector to be quantized;

wherein:

N is a positive integer larger than or equal to 1;

each basic codebook vector and each adjustment vector have same dimensions; and selecting the joint codebook vector for quantization among possible joint codebook vectors according to the deviation between the joint codebook vector and the vector to be quantized comprises:

calculating a residual vector between the vector to be quantized and the current basic codebook vector obtained from the basic codebook unit; wherein the residual vector has one or more residual sub-vectors, and the way of dividing into residual sub-vectors is the same as the way of dividing into basic sub-vectors;

for a basic sub-vector corresponding to an adjustment vector collection, selecting a best adjustment vector of the current basic sub-vector according to the deviation between the adjustment vector in the adjustment vector collection provided by the adjustment vector unit and the corresponding residual sub-vector;

accumulating a deviation of best adjustment vectors, and the deviation between the basic sub-vector not corresponding to the adjustment vector collection and the vector to be quantized, and using such a deviation as the deviation of the best joint codebook vector corresponding to the current basic codebook vector; and comparing the deviation of the best joint codebook vector corresponding to each basic codebook vector, and selecting a joint codebook vector for quantization.

2. The method according to claim 1, wherein the adjustment vector is generated before the quantization process is performed on said vector, comprising:

calculating an average vector of the N basic codebook vectors;

calculating a distance from the N basic codebook vectors to the average vector; and generating the adjustment vector the N basic codebook vectors according to the distance from the N basic codebook vectors to the average vector.

3. The method according to claim 2, wherein the adjustment vector of the basic codebook vectors is generated by generating the adjustment vector of the component of each dimension of the N basic codebook vectors.

4. The method according to claim 3, wherein generating the adjustment vector of the component of each dimension of the N basic codebook vectors comprises:

setting one or more scale factors corresponding to the adjustment vector of the component of each dimension of the N basic codebook vectors;

multiplying the distance from the basic codebook vectors to the average vector with the scale factors corresponding to the adjustment vector of a component of a current dimension, obtaining a plurality of products corresponding to the component of the current dimension of the N basic codebook vectors, and using the plurality of obtained products as an adjustment vector corresponding to the component of the current dimension of the N basic codebook vectors.

5. The method according to claim 2, wherein the method further comprises:

generating an index of the adjustment vectors.

6. The method according to claim 5, wherein generating the index number of the adjustment vectors comprises:

ordering the products corresponding to the component of the current dimension of the N basic codebook vector, and using the sequence numbers obtained by the product as an indexes of the adjustment vector corresponding to the product.

7. The method according to claim 2, wherein the average vector is an a-dimension vector, where a is a positive integer larger than or equal to 1, and calculating the average vector of the N basic codebook vectors comprises:

setting a component of dimension i of basic codebook vector j be $Y_j(i)$;

setting a component of dimension i of the average vector be $AV(i)$ from a formula:

$$AV(i) = \frac{\sum_{j=1}^{N} Y_j(i)}{N}, i = 1, 2, \ldots, a;$$

and
obtaining the average vector from a formula:

$AV(a)=\{AV(i), i=1,2,\ldots, a\}$.

8. The method according to claim 7, wherein the distance from the basic codebook vectors to the average vector is calculated from the formula:

$$AVS(j) = \sqrt{\frac{\sum_{i=1}^{a} [Y_j(i) - AV(i)]^2}{a}}, j = 1, 2, \ldots, N,$$

wherein $AVS(j)$ is the distance from the basic codebook vector j to the average vector.

9. The method according to claim 1, wherein calculating the residual vector between the basic codebook vectors and the adjustment vector of the codebook vectors among the vector to be quantized and the N basic codebook vectors comprises:

calculating a residual vector between the basic codebook vectors among the vector to be quantized and the N basic codebook vectors.

10. The method according to claim 9, wherein performing a quantization process on a vectors to be quantized by use of N basic codebook vectors and the adjustment vectors of the basic codebook vectors comprises:

performing the quantization process on the residual vector between the vectors to be quantized and codebook vectors by use of the adjustment vectors of each of the codebook vectors.

11. The method according to claim 10, wherein the number of the adjustment vectors corresponding to the component of each dimension of the codebook vectors is one or more, and performing the quantization process on the residual vector between the vectors to be quantized and codebook vectors by use of the adjustment vectors of each of the codebook vectors comprises:

calculating an absolute residual between the component on each dimension of the residual vector and each adjustment vector of the component on the same dimension of the codebook vector; and selecting a minimum absolute residual corresponding to the component of each dimension of the residual vector and the corresponding adjustment vector corresponding to the minimum absolute residual.

12. The method according to claim 11, wherein after selecting the minimum absolute residual corresponding to the component of each dimension of the residual vector and the corresponding adjustment vector corresponding to the minimum absolute residual, the method further comprises:

calculating the distortion between each residual vectors and the adjustment vector corresponding to the minimum absolute residual, including:

working out a square value of the minimum absolute residual corresponding to the component on each dimension of the residual vector, summing up the square values of the minimum absolute residues corresponding to the components on each dimension, and then using the sum as distortion between the residual vector and the adjustment vector corresponding to the same codebook vector.

13. The method according to claim 12, wherein after working out the square value of the minimum absolute residual corresponding to the component on each dimension of the residual vector, the method further comprises:

multiplying the square value with one or more corresponding weight coefficients, wherein said corresponding weight coefficients are real numbers.

14. The method according to claim 12, wherein each of the residual vector corresponds to a distortion, the number of the distortion is N, and the method further comprises:
selecting the minimum distortion from the N distortions, and using the codebook and the adjustment vector corresponding to the minimum distortion as a codebook and an adjustment vector for quantizing the vector to be quantized.

15. The method according to claim 14, wherein the method further comprises:
outputting the index of the codebook corresponding to the minimum distortion, and the index of the adjustment vector corresponding to the minimum distortion.

16. A device for quantizing vector comprising:
a codebook providing unit configured to transfer N codebook vectors corresponding to a vector to be quantized to a quantizing unit, and N is a positive integer larger than or equal to 1;
an adjustment vector providing unit configured to transfer adjustment vectors of the N codebook vectors to the quantizing unit; and
the quantizing unit configured to receive the adjustment vectors of the N codebook vectors from the adjustment vector providing unit, and from the codebook providing unit, perform a quantization process on a vector to be quantized by use of N codebook vectors and the adjustment vectors of each codebook vectors, and obtain codebook vectors and adjustment vectors for quantizing the vector to be quantized;
a residual vector calculating unit that calculates the residual vectors between the codebook vectors among the vector to be quantized and the N codebook vectors, and transferring the residual vectors to the quantizing unit;
a quantizing sub-unit configured to receive the adjustment vector of the N codebook vectors from the adjustment vector providing unit, and the residual vector from residual vector calculating unit, calculate the absolute residual between a component on each dimension of the each residual vector and each adjustment vector of the component on the same dimension of the corresponding codebook, select a minimum absolute residual corresponding to the component on each dimension of the residual vector, and transfer the calculation result of the minimum absolute residual corresponding to the component on each dimension of the residual vector to the calculating sub-unit;
a calculating sub-unit configured to receive the calculation result of the minimum absolute residual corresponding to the component on each dimension of each residual vector from the quantizing sub-unit, calculate a square value of the minimum absolute residual corresponding to the component on each dimension of the residual vector, sum the square values of the minimum absolute residues corresponding to the components on each dimension, calculate N distortions of N residual vectors using the sum as distortion between the residual vector and the adjustment vector, and transfer N distortions to the selecting sub-unit; and
a selecting sub-unit configured to receive N distortions from the calculating sub-unit, select a minimum distortion, and the codebook vectors and the adjustment vectors corresponding to the minimum distortion, and output the codebook vectors and the adjustment vectors corresponding to the minimum distortion,
wherein each basic codebook vector and each adjustment vector have same dimensions.

17. The device according to claim 16, wherein the device further comprises an adjustment vector generating unit configured to calculate the average vector of N codebook vectors, calculating a distance from the N codebook vectors to the average vector, generating one or more adjustment vectors of the N codebook vectors according to the distance from the N codebook vectors to the average vector, and transferring the generated adjustment vectors of the N codebook vectors to the adjustment vector providing unit.

18. The device according to claim 16, wherein the device further comprises an output unit for receiving the codebook vectors and the adjustment vectors corresponding to the minimum distortion from the selecting sub-unit, and outputting an index of the codebook corresponding to the minimum distortion and the index of the adjustment vector corresponding to the minimum distortion.

19. A method for vector quantization, comprising:
obtaining a vector to be quantized;
obtaining a basic codebook vector, wherein the basic codebook vector includes one or more basic sub-vectors, in the several basic sub-vectors; at least one K-dimension ($K \geq 2$) basic sub-vector corresponds to an adjustment vector collection which includes N adjustment vectors corresponding to the K-dimension basic sub-vectors; at least one adjustment vector collection meets the requirement that N is less than the quantity of all possible combinations of different values of each dimension of any dimension of all adjustment vectors in the collection;
obtaining an adjustment vector corresponding to the basic sub-vector;
wherein the combination of the basic codebook vector and the adjustment vector correspond to different basic sub-vectors as a joint codebook vector, and selecting a joint codebook vector for quantization among possible joint codebook vectors according to the deviation between the joint codebook vector and the vector to be quantized; and
obtaining an index of the basic codebook vector corresponding to the selected joint codebook vector and an index of the adjustment vector,
wherein the K-dimension basic codebook vector and the corresponding adjustment vector have same dimensions;
wherein selecting a joint codebook vector for quantization among possible joint codebook vectors according to the deviation between the joint codebook vector and the vector to be quantized comprises:
calculating a residual vector between the vector to be quantized and the current basic codebook vector obtained from the basic codebook unit; wherein the residual vector has one or more residual sub-vectors, and the way of dividing into residual sub-vectors is the same as the way of dividing into basic sub-vectors;
for a basic sub-vector corresponding to an adjustment vector collection, selecting a best adjustment vector of the current basic sub-vector according to the deviation between the adjustment vector in the adjustment vector collection provided by the adjustment vector unit and the corresponding residual sub-vector;
accumulating a deviation of best adjustment vectors, and the deviation between the basic sub-vector not corresponding to the adjustment vector collection and the vector to be quantized, and using such a deviation as the deviation of the best joint codebook vector corresponding to the current basic codebook vector; and comparing the deviation of the best joint codebook vector corresponding to each basic codebook vector, and selecting a joint codebook vector for quantization.

20. The method according to claim 19, wherein the method further comprises:
   obtaining a scale factor corresponding to the basic codebook vector;
   wherein the adjustment vector collection corresponding to one of the basic sub-vectors of the current basic vectors is a product of the adjustment coefficient vector corresponding to the basic sub-vector and the scale factor.

21. The method according to claim 19, wherein the act of selecting a joint codebook vector for quantization among possible joint codebook vectors according to the deviation between the joint codebook vector and the vector to be quantized comprises:
   adding the current basic codebook vector and optional adjustment vectors to form a joint codebook vector;
   calculating the deviation between the joint codebook vector currently and the vector to be quantized; and
   comparing the deviation between each different joint codebook vector and the vector to be quantized, and selecting a joint codebook vector for quantization.

22. The method according to claim 19, wherein obtaining the adjustment vector corresponding to the basic sub-vector comprises:
   searching for the relation vector collection corresponding to the basic sub-vectors, wherein the relation vector collection is a n adjustment vector collection or is in a function relation with the adjustment vector collection; and
   obtaining the corresponding adjustment vector according to the relation vector obtained from the relation vector collection; and
   wherein the index of the adjustment vector is a sequence number of the relation vector corresponding to the adjustment vector in the relation vector collection.

23. The method according to claim 22, wherein searching for the relation vector collection corresponding to the basic sub-vectors comprises:
   searching several sub-collections in the relation vector collection, the quantity of relation vectors contained in each sub-collection being equal to the quantity of all possible combinations of different values of each dimension of all relation vectors in the sub-collection;
   searching for different values of each dimension of the corresponding relation vector in each sub-collection; and wherein
   the index of the adjustment vector is a sequence number be expressed as the serial number of the relation vector sub-collection that has the relation vector, and the sequence number of the relation vector in the relation vector sub-collection.

24. The method according to claim 19, wherein obtaining the adjustment vector corresponding to the basic sub-vector comprises:
   searching for different values on each dimension of a relation vector corresponding to the basic sub-vector; and
   determining whether the combination of values on each dimension currently is a selectable valid relation vector; if so, obtaining the adjustment vector according to the currently obtained valid relation vector; if not, going on searching until the search succeeds;
   wherein the adjustment vector collection is the valid relation vector collection or is in a function relation with the valid relation vector collection, the index of the adjustment vector is a sequence number of the valid relation vector corresponding to the adjustment vector in the valid relation vector collection.

25. The method according to claim 24, wherein determining whether the combination of values on each dimension currently is a selectable valid relation vector comprises:
   calculating a sequence number of the combination of the currently obtained values of each dimension in possible combinations; and
   determining whether the value combination is a selectable valid relation vector according to a serial number.

26. A device for quantizing vector, comprising:
   a vector input unit, configured to obtain the vector to be quantized;
   a basic codebook unit, configured to provide a basic codebook vector, wherein the basic codebook vector includes one or more basic sub-vectors, in the several basic sub-vectors; at least one K-dimension (where $K \geq 2$) basic sub-vector corresponds to an adjustment vector collection which includes N adjustment vectors corresponding to the K-dimension basic sub-vectors; at least one adjustment vector collection meets the requirement that N is less than a quantity of all possible combinations of different values of each dimension of any dimension of all adjustment vectors in the collection;
   an adjustment vector unit, configured to provide an adjustment vector corresponding to the one or more basic sub-vectors; and
   a quantizing unit, configured to obtain the basic codebook vector and the adjustment vector from the basic codebook unit and the adjustment vector unit, the combination of the basic codebook vector and one or more adjustment vectors corresponding to different basic sub-sectors as a joint codebook vector, and select a joint codebook vector for quantization among the possible joint codebook vectors according to a deviation between the joint codebook vector and the vector obtained by the vector input unit,
   wherein the basic codebook vector and the corresponding adjustment vector have same dimensions;
   wherein the quantizing unit comprises:
   a residual calculating unit, configured to calculate the residual vector between the vector to be quantized and the basic codebook vector obtained from the basic codebook unit; wherein the residual vector has one or more residual sub-vectors, and the way of dividing into residual sub-vectors is the same as the way of dividing into basic sub-vectors;
   a residual quantizing unit, for a basic sub-vector corresponding to an adjustment vector collection, configured to select a best adjustment vector of the current basic sub-vector according to the deviation between the adjustment vector in the adjustment vector collection provided by the adjustment vector unit and the corresponding residual sub-vector; and
   a deviation accumulating unit, configured to accumulate a deviation of the best adjustment vectors, and the deviation between the basic sub-vector not corresponding to the adjustment vector collection and the vector to be quantized, and use such a deviation as the deviation of a joint codebook vector corresponding to the basic codebook vector; and
   a quantization selecting unit, configured to compare the deviation of the joint codebook vector corresponding to each basic codebook vector, and select a joint codebook vector for quantization.

27. The device according to claim 26, wherein the device further comprises:
- a scale factor unit, configured to provide a scale factor corresponding to the basic codebook vector currently provided by the basic codebook unit;
- wherein the adjustment vector provided by the adjustment vector is a product of the adjustment coefficient vector corresponding to the basic sub-vector and the scale factor provided by the scale factor unit.

28. The device according to claim 26, wherein the quantizing unit comprises:
- a joint vector unit, configured to add up the current basic codebook vector obtained from the basic codebook unit and the adjustment vector obtained from the adjustment vector unit to form a joint codebook vector;
- a deviation calculating unit, configured to calculate the deviation between the joint codebook vector currently generated by the joint vector unit and the vector to be quantized; and
- a comparing and selecting unit, configured to compare the deviation between each different joint codebook vector obtained by the deviation calculating unit and the vector to be quantized, and select a joint codebook vector for quantization.

29. The device according to claim 26, wherein the quantizing unit comprises:
- a collection providing unit, configured to provide a relation vector collection corresponding to the basic sub-vector, the relation vector collection being an adjustment vector collection or in a function relation with the adjustment vector collection; and
- an adjustment generating unit, configured to search for the relation vector collection, and obtain the corresponding adjustment vector according to the relation vector obtained from the relation vector collection;
- wherein the index of the adjustment vector obtained by the quantizing output unit is a sequence number of the relation vector corresponding to the adjustment vector in the relation vector collection.

30. The device according to claim 26, wherein the quantizing unit comprises:
- a surplus searching unit, configured to search for different values on each dimension of the relation vector corresponding to the basic sub-vector; and
- a vector selecting unit, configured to determine whether the combination of values on each dimension currently obtained by the surplus searching unit is a selectable valid relation vector; if so, obtaining the adjustment vector according to the currently obtained valid relation vector; if not, controlling the surplus searching unit to go on searching until the search succeeds; wherein the index of the adjustment vector obtained by the quantizing output unit is a sequence number of the relation vector corresponding to the adjustment vector in the relation vector collection.

* * * * *